United States Patent
Shiga et al.

(10) Patent No.: US 11,972,797 B2
(45) Date of Patent: Apr. 30, 2024

(54) MEMORY DEVICE

(71) Applicant: KIOXIA CORPORATION, Tokyo (JP)

(72) Inventors: Hidehiro Shiga, Yokohama Kanagawa (JP); Daisaburo Takashima, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 144 days.

(21) Appl. No.: 17/679,959

(22) Filed: Feb. 24, 2022

(65) Prior Publication Data

US 2023/0064982 A1 Mar. 2, 2023

(30) Foreign Application Priority Data

Aug. 27, 2021 (JP) .................. 2021-138579

(51) Int. Cl.
*G11C 13/00* (2006.01)
(52) U.S. Cl.
CPC ........ *G11C 13/004* (2013.01); *G11C 13/0004* (2013.01); *G11C 13/0038* (2013.01); *G11C 13/0069* (2013.01)
(58) Field of Classification Search
CPC .............. G11C 13/004; G11C 13/0004; G11C 13/0038; G11C 13/0069; G11C 13/0033; G11C 13/0061; G11C 2213/74; G11C 2213/79; G11C 13/0028; G11C 13/003; G11C 2213/71; G11C 2213/75

See application file for complete search history.

(56) References Cited

U.S. PATENT DOCUMENTS

| | | | |
|---|---|---|---|
| 9,455,301 B2 * | 9/2016 | Ratnam | .................. H10B 63/84 |
| 11,200,954 B2 * | 12/2021 | Wong | .................. G11C 11/5628 |
| 2008/0239799 A1 | 10/2008 | Watanabe | |
| 2012/0243307 A1 | 9/2012 | Takashima | |
| 2014/0269058 A1 * | 9/2014 | Liu | ................... G11C 16/3459 365/185.03 |
| 2020/0403035 A1 | 12/2020 | Ogiwara et al. | |

FOREIGN PATENT DOCUMENTS

JP 2021-002629 A 1/2021

* cited by examiner

*Primary Examiner* — Joshua L Schwartz
(74) *Attorney, Agent, or Firm* — Kim & Stewart LLP

(57) ABSTRACT

A memory device includes a memory cell array including a select transistor and a plurality of memory cells connected in series, each memory cell including a cell transistor and a variable resistance layer connected in parallel. During a write operation, a voltage setting circuit is controlled to apply a first voltage to a selected word line and a second voltage to non-selected word lines. The time period for applying the first voltage to the selected word line starts later than the time period for applying the second voltage to the non-selected word lines and ends earlier than the time period for applying the second voltage to the non-selected word lines.

20 Claims, 18 Drawing Sheets

MEMORY DEVICE

CROSS-REFERENCE TO RELATED APPLICATION

This application is based upon and claims the benefit of priority from Japanese Patent Application No. 2021-138579, filed Aug. 27, 2021, the entire contents of which are incorporated herein by reference.

FIELD

Embodiments described herein relate generally to a memory device.

BACKGROUND

A memory device in which variable resistance memory elements such as a resistive random access memory (ReRAM) element, an alloy type phase change memory (PCM) element, and an interfacial phase change memory (iPCM) element are integrated on a semiconductor substrate is being developed.

DETAILED DESCRIPTION

Figure 1:
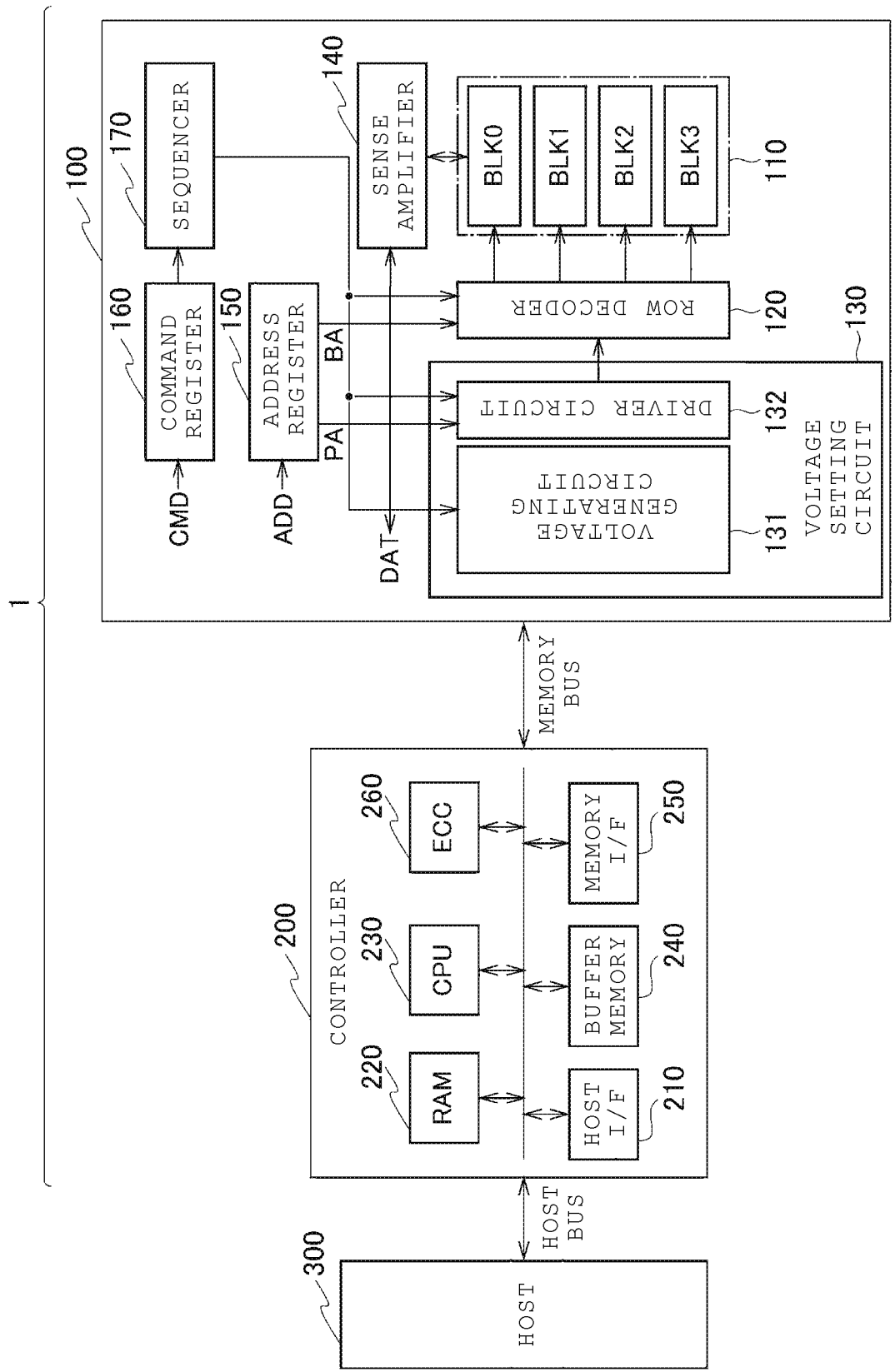
FIG. 1 is a block diagram illustrating a configuration of a memory system having a memory device according to an embodiment.

Embodiment provide a memory device capable of preventing erroneous writing of data into a memory cell that is not a target of a write operation.

In general, according to one embodiment, a memory device includes a memory cell array and a voltage setting circuit. The memory cell array includes a plurality of memory strings, a plurality of first voltage applying electrodes, and a second voltage applying electrode, wherein each of the memory strings includes a select transistor and a plurality of memory cells connected in series, and each of the memory cells includes a cell transistor and a variable resistance layer connected in parallel, the cell transistor of each memory cell having a gate connected to one of the first voltage applying electrodes and the select transistor having a gate connected to the second voltage applying electrode. The voltage setting circuit is controlled to apply different voltages to the first voltage applying electrodes. During a write operation that targets one of the memory cells in one of the memory strings, the voltage setting circuit is controlled to: at a first point in time, apply a first voltage to the first voltage applying electrodes, which include a selected first voltage applying electrode that is connected to the gate of the targeted memory cell, and non-selected first voltage applying electrodes that are respectively connected to the gates of other memory cells in the memory string of the targeted memory cell; at a second point in time after the first point time, maintain the voltage applied to the selected first voltage applying electrode at the first voltage and apply a second voltage higher than the first voltage to the non-selected first voltage applying electrodes; at a third point in time after the second point time, maintain the voltage applied to the non-selected first voltage applying electrodes at the second voltage and apply a third voltage lower than the first voltage to the selected first voltage applying electrode; at a fourth point in time after the third point time, maintain the voltage applied to the non-selected first voltage applying electrodes at the second voltage and apply the first voltage to the selected first voltage applying electrode; and at a fifth point in time after the fourth point time, maintain the voltage applied to the selected first voltage applying electrode at the first voltage and apply the first voltage to the non-selected first voltage applying electrodes.

Next, embodiments will be described with reference to the drawings. In the description of the drawings described below, the same or similar components are denoted by the same or similar reference numerals. The drawings are schematic. In addition, the embodiments illustrated below are examples of devices and methods for embodying the technical idea and do not limit the technical idea to the particular materials, shapes, structures, arrangements, and the like of the components of the examples. The embodiments can be modified in various ways.

First of all, the configuration of a memory system 1 including a memory device according to the embodiment will be described with reference to FIG. 1.

The memory system 1 illustrated in FIG. 1 includes the memory chip 100 as the memory device and a controller 200. For example, the memory chip 100 and the controller 200 may be integrated into one semiconductor device, e.g., a memory card, a solid state drive (SSD), and the like.

The memory chip 100 includes a plurality of memory cells and stores data in a non-volatile manner. The controller 200 is connected to the memory chip 100 by a memory bus and is connected to a host 300 by a host bus. The controller 200 controls the memory chip 100. In addition, the controller 200 accesses the memory chip 100 in response to a host command received from the host 300. The host 300 is, for example, a digital camera or a personal computer. The host bus is a bus conforming to an interface standard between the controller 200 and the host 300. The memory bus performs transmission and reception of signals according to the interface standard between the controller 200 and the memory chip 100.

Next, the configuration of the controller 200 illustrated in FIG. 1 will be described. The controller 200 includes a host interface circuit (host I/F) 210, a built-in memory (RAM) 220, a processor (CPU) 230, a buffer memory 240, a memory interface circuit (memory I/F) 250, and an ECC circuit 260.

The host interface circuit 210 is connected to the host 300 via the host bus. The host interface circuit 210 transfers the host command and data received from the host 300 to the processor 230 and the buffer memory 240, respectively. In addition, the host interface circuit 210 transfers the data stored in the buffer memory 240 to the host 300 in response to instructions of the processor 230.

The built-in memory 220 is used as a work area of the processor 230. The built-in memory 220 stores firmware for managing the memory chip 100, various management tables such as a shift table, a history table, and a flag table. The built-in memory 220 is, for example, a semiconductor memory such as a dynamic random access memory (DRAM) or a static random access memory (SRAM).

The processor 230 controls the operation of the entire controller 200. For example, when the processor 230 receives a host command related to reading, from the host 300, the processor 230 causes the memory interface circuit 250 to issue a read command (memory command) to the memory chip 100 in response to the host command. The processor 230 causes the memory interface circuit 250 to issue a write command (memory command) to the memory chip 100 in response to the host command when the processor receives the host command related to writing, from the host 300. In addition, the processor 230 executes various processes (such as wear leveling) for managing the memory chip 100.

The buffer memory 240 temporarily stores the write data for the memory chip 100 and the read data from the memory chip 100.

The memory interface circuit 250 is connected to the memory chip 100 via the memory bus and manages communication between the memory chip 100 and the controller 200. The memory interface circuit 250 transmits various signals to the memory chip 100 based on the instructions received from the processor 230 and receives various signals from the memory chip 100.

The ECC circuit 260 performs error detection and error correction processing on the data stored in the memory chip 100. The ECC circuit 260 generates an error correction code when writing data and assigns the error correction code to the write data. In addition, the ECC circuit 260 decodes the read data when reading the data.

Next, the configuration of the memory chip 100 illustrated in FIG. 1 will be described. The memory chip 100 includes a memory cell array 110, a row decoder 120, a voltage setting circuit 130, a sense amplifier 140, an address register 150, a command register 160, and a sequencer 170.

The memory cell array 110 includes a plurality of memory blocks BLK0 to BLK3, each of which has a plurality of non-volatile memory cells associated with rows (word lines) and columns (bit lines). When the description is not limited to one of the memory blocks BLK0 to BLK3, the memory block is denoted as a memory block BLK. In FIG. 1, four memory blocks BLK0 to BLK3 are illustrated as an example of the memory cell array 110, but the number of memory blocks BLK provided in the memory cell array 110 is not limited to four. The memory cell array 110 stores the data transmitted from the controller 200.

The row decoder 120 selects one of the memory blocks BLK0 to BLK3 based on a block address BA in the address register 150 and further selects a word line in the selected memory block BLK.

The voltage setting circuit 130 includes a voltage generating circuit 131 and a driver circuit 132. The voltage generating circuit 131 generates a voltage to be supplied to the memory block BLK. The driver circuit 132 supplies a voltage to the selected memory block BLK via the row decoder 120 based on a page address PA in the address register 150. The driver circuit 132 also includes, for example, a source line driver and the like.

As will be described in detail later, the memory cell of the memory cell array 110 has a configuration in which a cell transistor associated with any one of a plurality of word lines and a variable resistance memory region are connected in parallel. The voltage setting circuit 130 controls a conduction state of the cell transistor of the memory cell by setting voltages of the word lines and adjusts the timing of setting the voltage for each word line. The voltage set by the voltage setting circuit 130 and the timing of setting the voltage are controlled by the sequencer 170.

The sense amplifier 140 includes a sense amplifier module provided for each bit line, and when reading data, the sense amplifier senses the data read from the memory cell array 110 via the bit line and performs necessary operations to generate data DAT. Then, the sense amplifier 140 outputs the data DAT to the controller 200. When writing the data, the sense amplifier 140 transfers the data DAT received from the controller 200 to the memory cell array 110 via the bit line.

The address register 150 stores the address ADD received from the controller 200. The address ADD includes the block address BA and the page address PA described above. The command register 160 stores a command CMD received from the controller 200.

The sequencer 170 controls the operation of the entire memory chip 100 based on the command CMD stored in the command register 160.

Figure 2:
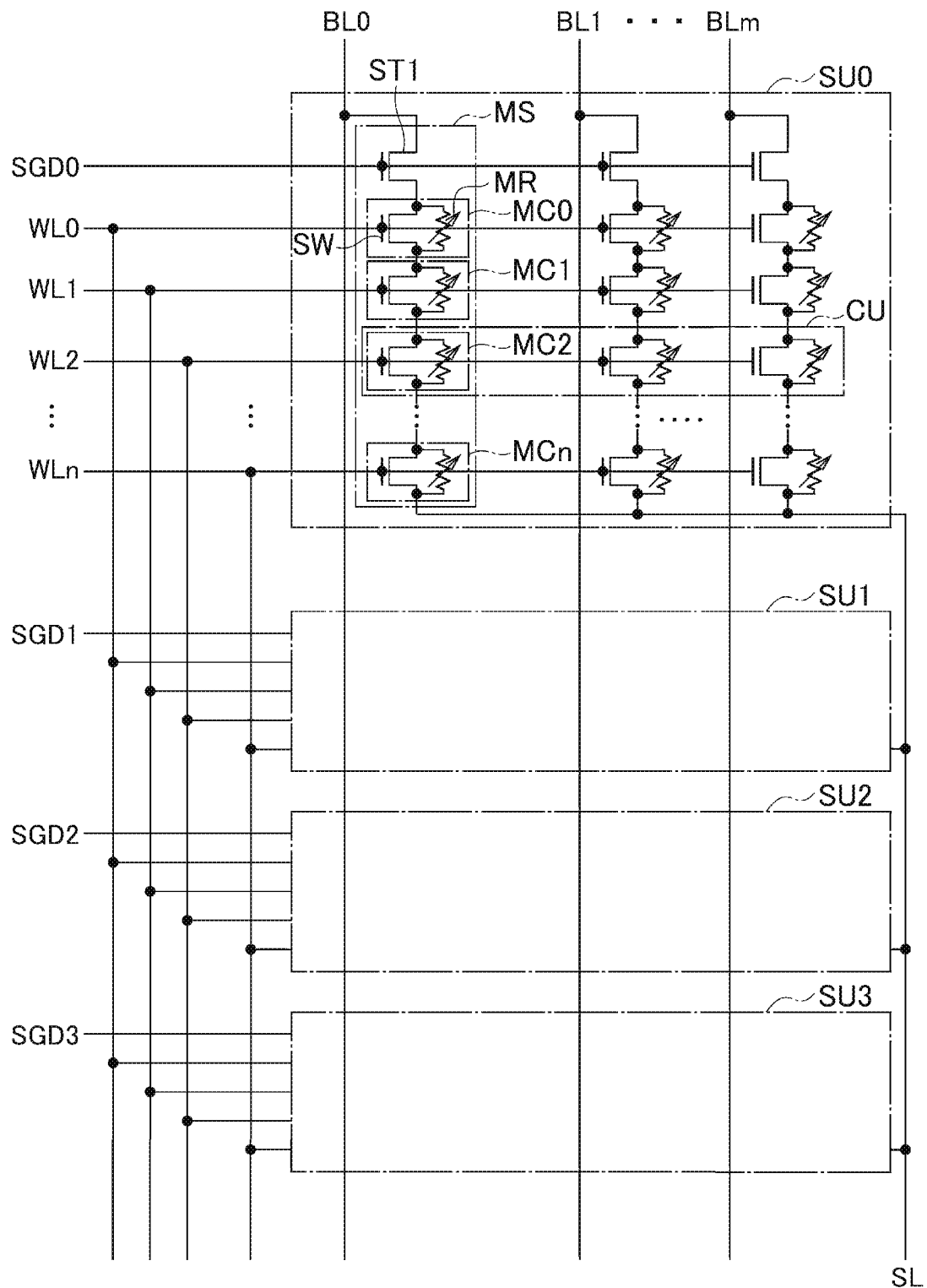
FIG. 2 is a circuit diagram illustrating a configuration of a memory block.

Next, the configuration of the memory block BLK of the memory cell array 110 will be described with reference to FIG. 2. As illustrated in FIG. 2, the memory block BLK includes, for example, four string units SU (SU0 to SU3). It is noted that the number of string units SU in the memory block BLK may be any number. Each string unit SU includes a plurality of memory strings MS. The memory cell array 110 has a configuration in which a plurality of memory strings MS are arranged therein.

Each of the memory strings MS includes, for example, (n+1) memory cells MC (MC0, MC1, ..., MCn) (n is a natural number of 1 or more) and a select transistor ST1. The memory cells MC0, MC1, ..., MCn provided in the memory string MS are connected in series between the select transistor ST1 and a source line SL. Hereinafter, when the description is not limited to one of the memory cells MC0, MC1, ..., MCn, the memory cell is denoted as a memory cell MC. The number of memory cells MC provided in each of the memory strings MS may be, for example, 8, 32, 48, 64, 96, 128, or the like, and the number of memory cells MC provided in the memory string MS is not limited to any particular number. The select transistor ST1 is, for example, an n-channel metal-oxide-semiconductor (MOS) transistor.

As described above, the memory string MS includes a serial connection of the plurality of memory cells MC and the select transistor ST1 for selecting the memory cells MC. Specifically, the select transistor ST1 is connected to a first end of the serial connection structure of the plurality of memory cells MC that make up the memory string MS, and the source line SL is connected to a second end of the serial connection structure. It is noted that the number of select transistors ST1 provided in each of the memory strings MS may be one or any number.

The memory cell MC has a configuration in which a cell transistor SW and a variable resistance memory region MR are connected in parallel. A first main electrode of the cell transistor SW is connected to a first terminal of the variable resistance memory region MR, and a second main electrode of the cell transistor SW is connected to a second terminal of the variable resistance memory region MR. For example, the first main electrode is a drain electrode, and the second main electrode is a source electrode. The conductive state of the cell transistor SW is controlled by a voltage applied to a gate electrode of the cell transistor SW. Hereinafter, the gate electrode of the cell transistor SW is also referred to as a "control gate of the memory cell MC". The cell transistor SW is, for example, an n-channel MOS transistor.

The variable resistance memory region MR functions as a memory element of the memory cell MC and is also referred to as a "variable resistance layer" or a "variable resistance element". The variable resistance memory region MR contains a phase change material having different electrical resistance according to a crystal state. Hereinafter, the change in the crystal state of the phase change material is referred to as a "phase change". The variable resistance memory region MR is a variable resistance memory element of which state is changed to a low resistance state or a high resistance state due to the phase change.

The memory chip 100 stores data by utilizing a difference in relative electrical resistance values of the variable resistance memory region MR. A case where the variable resistance memory region MR is in the low resistance state is also referred to as a "set state", and a case where the variable resistance memory region MR is in the high resistance state is also referred to as a "reset state". For example, when the crystal state of the variable resistance memory region MR is changed to be amorphous, the variable resistance memory region MR goes into the high resistance state. On the other hand, when the crystal state of the variable resistance memory region MR changes and crystallizes, the variable resistance memory region MR goes into the low resistance state. One example of the variable resistance memory region MR is an alloy type phase transition element ($Ge_2Sb_2Te_5$).

The control gate of each memory cell MC0 of the plurality of memory strings MS provided in the same memory block BLK is commonly connected to a word line WL0. Similarly to the memory cell MC0, the control gates of the memory cells MC1, ..., MCn of the plurality of memory strings MS provided in the same memory block BLK are commonly connected to word lines WL1, WLn, respectively.

Hereinafter, when the description is not limited to one of the word lines WL0, WL1, ..., WLn, the word line is denoted as a word line WL. The memory cell MC has, for example, a configuration in which the cell transistor SW associated with any one of the (n+1) word lines WL0, WL1, ..., WLn and the variable resistance memory region MR are connected in parallel. In the following, the word line WL to which the memory cell MC is associated is also referred to as a "word line of the memory cell MC".

It is noted that, in the following description, the plurality of the memory cells MC connected to the common word line WL in each string unit SU will be referred to as a cell unit (CU). A set of 1-bit data stored in the cell unit is referred to as a "page". Therefore, when 2-bit data is stored in one memory cell MC, the cell unit stores data for two pages.

The gate electrodes of the plurality of select transistors ST1 in the string unit SU are commonly connected to the select gate line SGD. More specifically, the gate electrodes of the plurality of select transistors ST1 in a string unit SU0 are commonly connected to a select gate line SGD0. Similarly to the string unit SU0, the gate electrodes of the plurality of select transistors ST1 in a string unit SU1 are commonly connected to a select gate line SGD1. The gate electrodes of the plurality of select transistors ST1 in a string unit SU2 are commonly connected to a select gate line SGD2. The gate electrodes of the plurality of select transistors ST1 in a string unit SU3 are commonly connected to the select gate line SGD3. In the following, when the description is not limited to one of the select gate lines SGD0, SGD1, ..., the select gate line is denoted as a select gate line SGD.

Each of the select gate line SGD and the word line WL is independently controlled by the row decoder 120.

The drain electrodes of the select transistors ST1 of the memory string MS in the same row in the memory cell array 110 are commonly connected to bit lines BL0, BL1, ..., BLm (m is a natural number of 1 or more). In the following, when the description is not limited to one of the bit lines BL0, BL1, ..., BLm, the bit line is denoted as a bit line BL. A current is supplied from the bit line BL to the memory string MS via the select transistor ST1. Hereinafter, the current supplied from the bit line BL to the memory string MS is also referred to as a "cell current". The bit lines BL are commonly connected to the memory string MS across the plurality of memory blocks BLK. Furthermore, the source electrodes of the plurality of memory cells MCn are commonly connected to the source line SL.

That is, the string unit SU includes the plurality of memory strings MS that are connected to different bit lines BL and connected to the same select gate line SGD. In addition, the memory block BLK includes the plurality of string units SU having the common word lines WL. The memory cell array 110 includes the plurality of memory blocks BLK having the common bit lines BL.

The write operation and the read operation for the memory cell MC are executed by controlling the voltages applied to the word line WL, the select gate line SGD, the source line SL, and the bit line BL. Hereinafter, the word line WL is also referred to as a first voltage applying electrode, the select gate line SGD as a second voltage applying electrode, the source line SL as a third voltage applying electrode, and the bit line BL as a fourth voltage applying electrode.

The operation of the memory cell MC will be described below. The cell transistor SW has a structure in which the semiconductor layer and the gate electrode face each other via a gate insulating film, which will be described in detail later. When a predetermined voltage is applied to the gate electrode, an inversion layer is formed in the semiconductor layer, and thus, the cell transistor SW is electrically connected.

In the memory cell array 110, the cell transistor SW of the memory cell MC selected as a target of the write operation or the read operation (hereinafter, also referred to as a "selected memory cell MC") is in the OFF state (non-conductive state). For this reason, in the selected memory cell MC, the cell current flows through the variable resistance memory region MR. On the other hand, in the non-selected memory cell MC, the cell transistor SW enters an ON state (conductive state). For this reason, in the non-selected memory cell MC, the cell current also flows through the cell transistor SW.

When the variable resistance memory region MR of the selected memory cell MC has high resistance (in the reset state), the cell current flowing through the variable resistance memory region MR is small. For this reason, the voltage of the bit line BL is slowly decreased. On the other hand, when the variable resistance memory region MR of the selected memory cell MC has low resistance (in the set state), the cell current flowing through the variable resistance memory region MR is large. For this reason, the voltage of the bit line BL is rapidly decreased. Therefore, it is possible to determine whether the variable resistance memory region MR is in the reset state or the set state based on a speed of change of the voltage of the bit line BL. The ratio of the resistance of the variable resistance memory region MR of the selected memory cell MC to a total resistance from the bit line BL to the source line SL is sufficiently large. For this reason, it is possible to determine whether the variable resistance memory region MR of the selected memory cell MC is in the high resistance state or the low resistance state.

Figure 3:
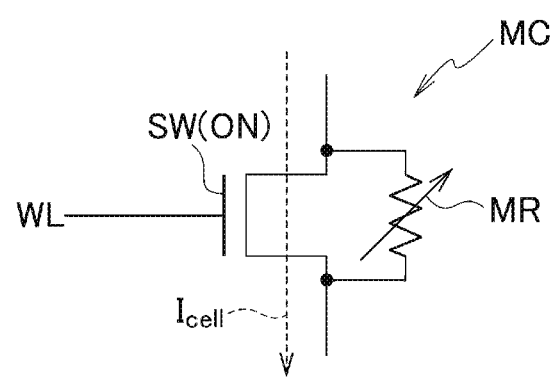
FIG. 3 is a circuit diagram illustrating a current path flowing in a memory cell when a cell transistor is in an ON state.

FIG. 3 illustrates a current path of the cell current Icell flowing through the memory cell MC when the cell transistor SW enters an ON state. As illustrated in FIG. 3, when the cell transistor SW enters an ON state, an inversion layer is formed in the semiconductor layer of the cell transistor SW, and the cell current Icell flows through the inversion layer. It is noted that the resistance value of the variable resistance memory region MR that is in the low resistance state is 10 times or more higher than the resistance value of the semiconductor layer that enters an ON state of the cell transistor SW. For this reason, when the cell transistor SW enters an ON state, even in a case where the variable resistance memory region MR is in the low resistance state, the cell current Icell flows through the cell transistor SW.

Figure 4:
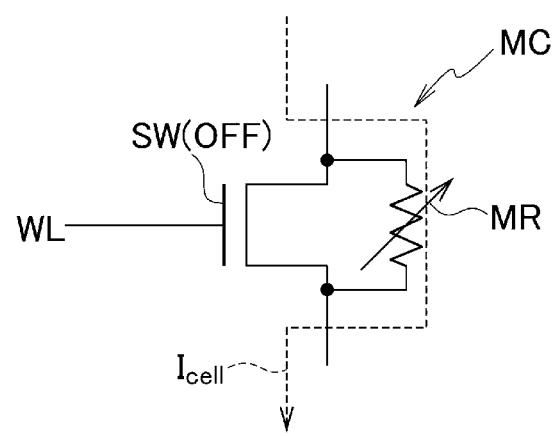
FIG. 4 is a circuit diagram illustrating a current path flowing in the memory cell when the cell transistor is in an OFF state.

FIG. 4 illustrates a current path of the cell current Icell flowing through the memory cell MC when the cell transistor SW is in the OFF state. When the cell transistor SW is in the OFF state, since no inversion layer is formed in the semiconductor layer of the cell transistor SW, the cell current Icell flows through the variable resistance memory region MR as illustrated in FIG. 4. It is noted that the resistance value of the variable resistance memory region MR that is in the high resistance state is 10 times or more lower than the resistance value of the semiconductor layer that is in the OFF state of the cell transistor SW. For this reason, when the cell transistor SW is in the OFF state, even in a case where the variable resistance memory region MR is in the high resistance state, the cell current Icell flows through the variable resistance memory region MR.

Figure 5:
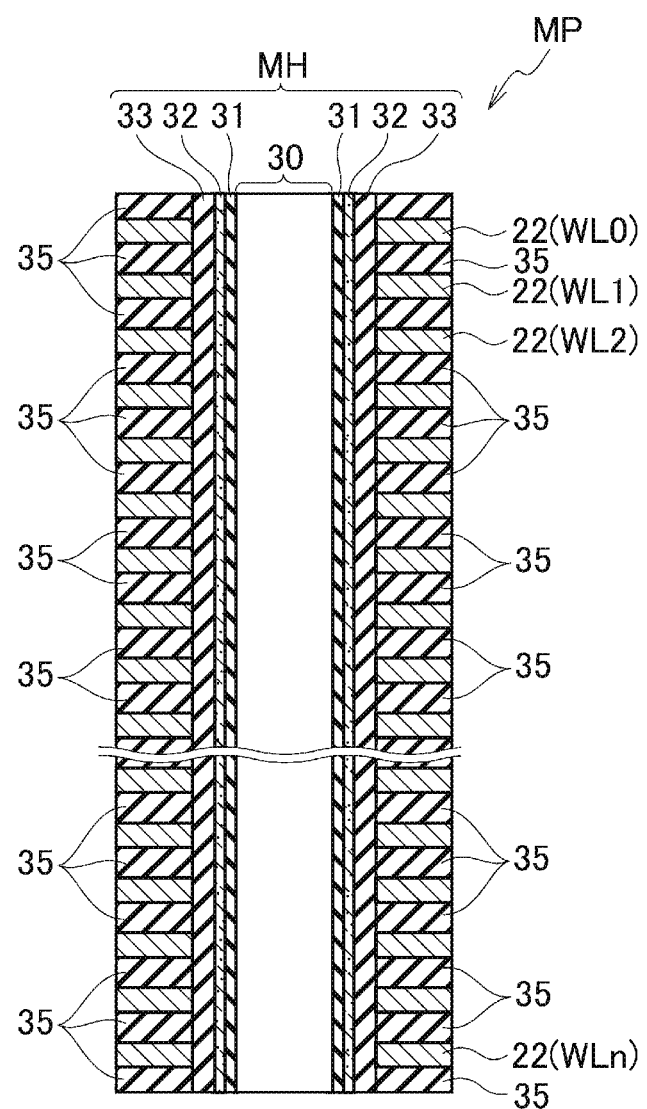
FIG. 5 is a schematic cross-sectional view illustrating a cross section of a memory pillar.

An example of the structure of the memory cell array 110 formed on the semiconductor substrate will be described below. First, a memory pillar MP provided in the memory cell array 110 will be described with reference to FIG. 5. The memory pillar MP is a structure of the memory cell MC formed by three-dimensionally stacking a conductor layer and an insulating film. FIG. 5 illustrates an example of a cross-sectional structure of the memory pillar MP.

The memory pillar MP has a configuration in which conductor layers 22 and insulator layers 35 are alternately stacked along the Z direction. The conductor layer 22 is formed in a plate shape spreading along an XY plane perpendicular to the Z direction. The plurality of conductor layers 22 are used as the word lines WL0, WL1, . . . , WLn, respectively. The conductor layer 22 contains, for example, tungsten (W). The Z direction is also referred to as a "first direction", and the direction in which the conductor layer 22 extends is also referred to as a "second direction".

A memory hole MH is formed in the memory pillar MP so as to penetrate the stacked structure of the conductor layer 22 and the insulator layer 35 in the Z direction. The memory hole MH has, for example, a cylindrical shape extending in the Z direction. An insulator layer 33, a semiconductor layer 32, a variable resistance layer 31, and a core portion 30 are stacked in this order on the inside (inner wall) of the memory hole MH. That is, the memory pillar MP includes the cylindrical insulator layer 33 that covers the inner wall of the memory hole MH and extends in the Z direction, the cylindrical semiconductor layer 32 that covers the inner wall of the insulator layer 33 and extends in the Z direction, and the cylindrical variable resistance layer 31 that covers the inner wall of the semiconductor layer 32 and extends in the Z direction.

The core portion 30 has, for example, a cylindrical shape extending in the Z direction. For example, a material having a higher thermal resistance than silicon oxide ($SiO_2$) may be applied to the core portion 30. In addition, a vacuum region or a region containing inert gas may be employed as the core portion 30.

When the core portion 30 is formed with vacuum, the degree of vacuum may be, for example, in the range of $10^5$ Pa to $10^2$ Pa for a low vacuum and $10^2$ Pa to $10^{-1}$ Pa for a medium vacuum. In addition, the degree of vacuum of the core portion 30 may be, for example, in the range of $10^{-1}$ Pa to $10^{-5}$ Pa in a high vacuum and $10^{-5}$ Pa to $10^{-8}$ Pa in an ultra high vacuum.

When the core portion 30 is formed with inert gas, for example, a rare gas such as helium, neon, argon, krypton, xenon, radon, or oganesson, or nitrogen gas may be applied.

The variable resistance layer 31 covers a side surface (outer circumference) of the core portion 30 to be in contact with the core portion 30. The variable resistance layer 31 is formed, for example, in a cylindrical shape extending in the Z direction. By allowing a material having a higher thermal resistance than silicon oxide, such as a vacuum region, or a region containing an inert gas, to be employed as the core portion 30, the heat generation temperature in the variable resistance layer 31 can be increased.

The semiconductor layer 32 covers a side surface (outer circumference) of the variable resistance layer 31 to be in contact with the variable resistance layer 31. The semiconductor layer 32 is formed, for example, in a cylindrical shape extending in the Z direction. The thickness of the variable resistance layer 31 is, for example, 20 nm or less. The diameter of the core portion 30 is larger than the thickness of the variable resistance layer 31 and is, for example, several tens of nm or more.

The insulator layer 33 covers a side surface of the semiconductor layer 32. The insulator layer 33 includes, for example, a portion formed in a cylindrical shape. The insulator layer 33 includes an insulator such as silicon oxide. In addition, the conductor layer 22 covers a portion of a side surface of the insulator layer 33 to be in contact with the insulator layer 33.

The plurality of conductor layers 22 disposed apart from each other in the Z direction are used as the word lines WL0, WL1, . . . , WLn, respectively. The semiconductor layer 32 is a semiconductor layer on which an inversion layer of the cell transistor SW is formed. The insulator layer 33 covering the side surface of the semiconductor layer 32 is the gate insulating film of the cell transistor SW. The conduction state of the cell transistor SW is controlled according to the voltage of the conductor layer 22 which is the word line WL. Then, the variable resistance layer 31 functions as a variable resistance memory region MR of the memory cell MC. In this manner, in the memory pillar MP, the plurality of memory cells MC are connected in series along the Z direction.

When the memory cell MC is selected, the cell current Icell flows through a thin region of the variable resistance layer 31 which is in contact with the semiconductor layer 32. The film thickness of the variable resistance layer 31 is made thinner than the diameter of the core portion 30. By making the film thickness of the variable resistance layer 31 to be thinner than the diameter of the core portion 30, the current density flowing through the variable resistance layer 31 can be set high. As a result, the heat generation temperature in the memory cell MC is increased, and localization of a heat generation portion is improved. By improving the localization of the heat generation portion, it is possible to prevent heat generation in the memory cell MC adjacent to the selected memory cell MC and reduce disturbance to the adjacent memory cell MC that may result in data destruction in the adjacent memory cell MC.

Next, an example of the structure of the memory cell array 110 will be described. It is noted that, in the drawings referred to below, the X direction corresponds to the extending direction of the bit line BL, the Y direction corresponds to the extending direction of the word line WL, and the Z direction corresponds to the direction perpendicular to the surface of the semiconductor substrate 20 on which the memory cell array 110 is formed.

Figure 6:
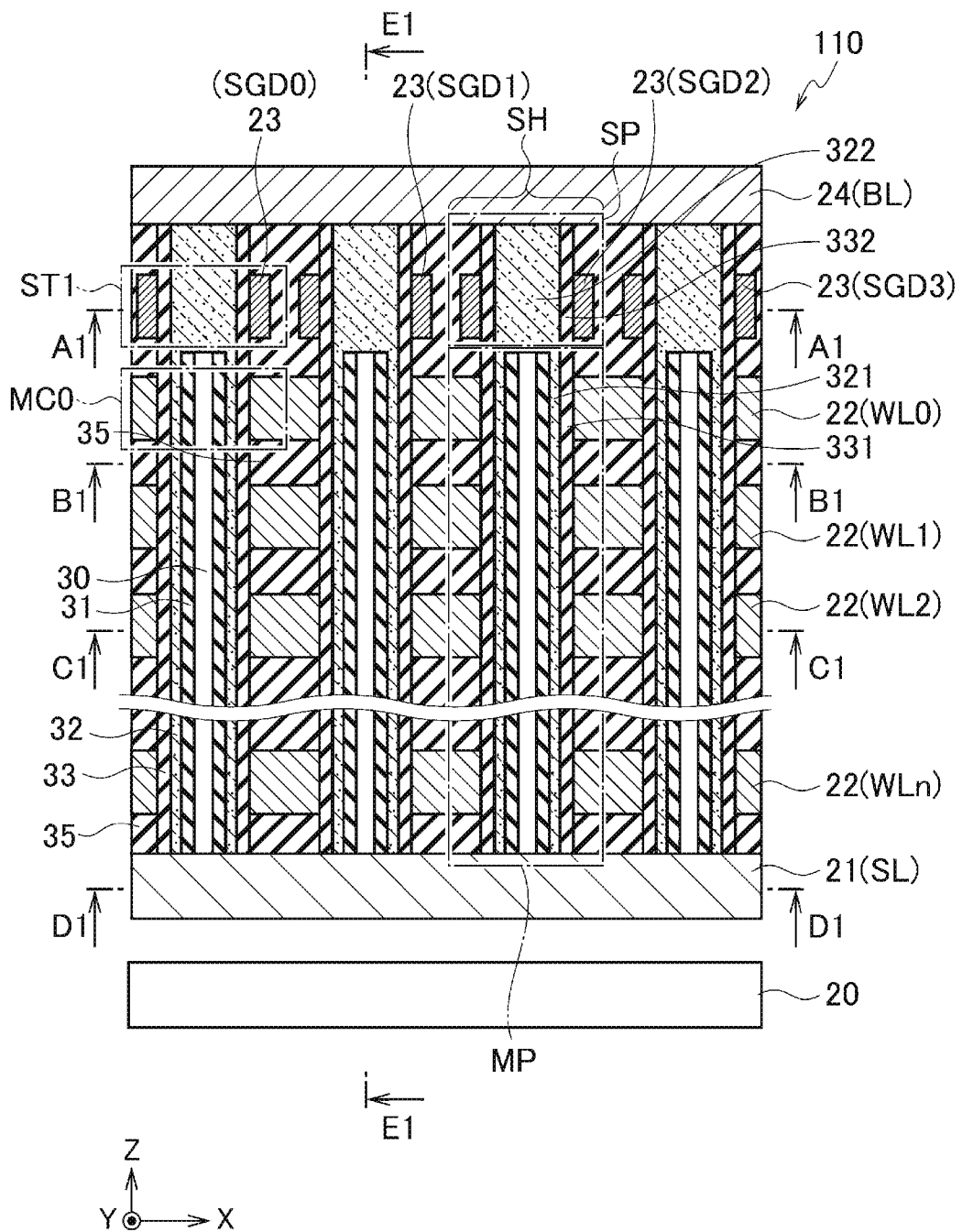
FIG. 6 is a schematic cross-sectional view illustrating a cross section of a memory cell array.

FIG. 6 illustrates an example of the cross-sectional structure of the memory cell array 110. As illustrated in FIG. 6, the memory cell array 110 includes, for example, conductor layers 21 to 24. The conductor layers 21 to 24 are disposed above the semiconductor substrate 20.

Specifically, the conductor layer 21 is disposed above the semiconductor substrate 20 in the Z direction via the insulator layer (not illustrated). For example, a circuit such as a sense amplifier 140 may be disposed in the insulator layer between the semiconductor substrate 20 and the conductor layer 21. The conductor layer 21 is formed in a plate shape spreading along the XY plane, for example, and is used as the source line SL. The conductor layer 21 contains, for example, silicon (Si).

The insulator layers 35 and the conductor layers 22 are alternately stacked above the conductor layer 21 in the Z direction. The conductor layer 22 is formed, for example, in a plate shape spreading along the XY plane. The plurality of conductor layers 22 disposed apart from each other are used as the word lines WLn, . . . , WL0 in this order from the semiconductor substrate 20 side, respectively.

The conductor layer 23 is disposed above the uppermost conductor layer 22 (WL0) in the Z direction via an insulator layer. The conductor layer 23 extends in the Y direction and is divided in the X direction for each select pillar SP described later. The divided conductor layers 23 are used as the select gate lines SGD0 to SGD3, respectively. The conductor layer 23 contains, for example, tungsten W.

The conductor layer 24 is disposed above the conductor layer 23 in the Z direction via the insulator layer. For example, the conductor layer 24 is formed in a line shape extending along the X direction and is used as the bit line BL. The conductor layer 24 contains, for example, copper (Cu).

As illustrated in FIG. 6, the cylindrical select pillar SP that penetrates the conductor layer 23 and reaches the memory pillar MP at the bottom is disposed above the memory pillar MP in the Z direction. The select pillar SP includes the semiconductor layer 32 and the insulator layer 33 that continuously extend in the Z direction from the memory pillar MP. Specifically, an SGD hole SH penetrating the conductor layer 23 in the Z direction is formed for the select pillar SP, and the insulator layer 33 and the semiconductor layer 32 are disposed in this order from the inside (inner wall) of the SGD hole SH. That is, the select pillar SP includes the cylindrical insulator layer 33 that covers the inner wall of the SGD hole SH and extends in the Z direction and the cylindrical semiconductor layer 32 that covers the inner wall of the insulator layer 33 and extends in the Z direction. In addition, the conductor layer 23 covers a portion of the side surface of the insulator layer 33 in the select pillar SP to be in contact with the insulator layer 33. It is noted that, with respect to the select pillar SP, similarly to the memory pillar MP, the core portion 30 may be provided inside of the semiconductor layer 32.

The bottom of the semiconductor layer 32 of the select pillar SP is in contact with the semiconductor layer 32, the variable resistance layer 31, and the core portion 30 of the memory pillar MP. It is noted that a layer including a boundary between the memory hole MH and the SGD hole SH is between the conductor layer 22 and the conductor layer 23, which is the uppermost conductor layer of the stacked conductor layers.

The core portion 30, the variable resistance layer 31, the semiconductor layer 32, and the bottom portion of the insulator layer 33 of the memory pillar MP are in contact with the conductor layer 21. That is, the semiconductor layer 32 is electrically connected to the conductor layer 21 which is the source line SL (third voltage applying electrode).

In the semiconductor layers 32 of the memory pillar MP and the select pillar SP, the portion forming a part of the cell transistor SW is referred to as a "first semiconductor layer 321", and the portion forming a part of the select transistor ST1 is referred to as a "second semiconductor layer 322". In addition, in the insulator layers 33 of the memory pillar MP and the select pillar SP, the portion forming a part of the cell transistor SW is referred to as a "first insulator layer 331", and the portion forming a part of the select transistor ST1 is referred to as a "second insulator layer 332".

That is, the cell transistor SW has the first semiconductor layer 321 that covers the side surface of the variable resistance layer 31 that is the variable resistance memory region MR and the first insulator layer 331 that covers the side surface of the first semiconductor layer 321. In the cell transistor SW, one of the word lines WL (first voltage applying electrode) faces the first semiconductor layer 321 via the first insulator layer 331. When the cell transistor SW is turned on, an inversion layer is formed on the first semiconductor layer 321. The select transistor ST1 includes the second semiconductor layer 322 and the second insulator layer 332 that covers the side surfaces of the second semiconductor layer 322. In the select transistor ST1, the select gate line SGD (second voltage applying electrode) faces the second semiconductor layer 322 via the second insulator layer 332. When the select transistor ST1 is turned on, an inversion layer is formed on the second semiconductor layer 322.

As described above, the memory string MS has a configuration in which the select transistor ST1, the plurality of memory cells MC, and the source line SL (third voltage applying electrode) are disposed in series in this order along the Z direction. The first semiconductor layer 321 and the second semiconductor layer 322 are continuously formed, and the first insulator layer 331 and the second insulator layer 332 are continuously formed.

Figure 7:
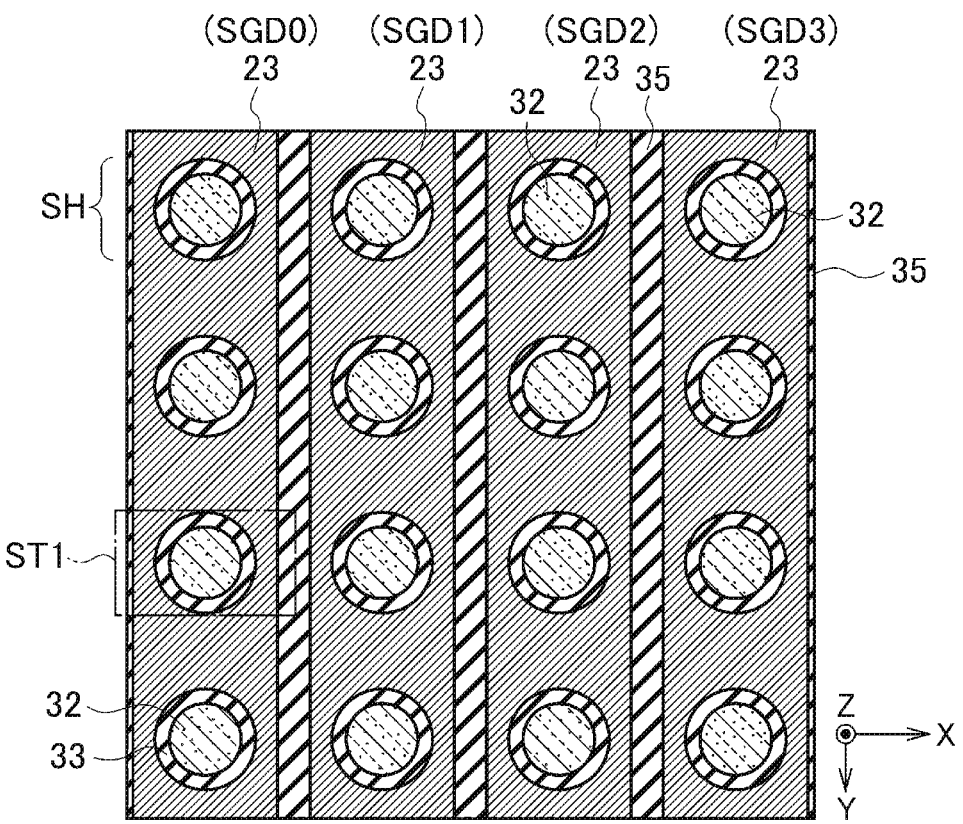
FIG. 7 illustrates a cross-section taken along line A1-A1 in FIG. 6.

Next, a plane pattern configuration of the conductor layer 23 will be described with reference to FIG. 7. As illustrated in FIG. 7, the insulator layer 33 and the semiconductor layer 32 are disposed in the SGD hole SH penetrating the conductor layer 23. The conductor layer 23 functions as select gate lines SGD0 to SGD3 of the select transistor ST1. The insulator layer 33 functions as a gate insulating film of the select transistor ST1, and the semiconductor layer 32 functions as a semiconductor layer of the select transistor ST1. By using this select transistor ST1, the memory pillar MP can be selected for each word line WL. That is, by allowing the select transistor ST1 to enter an ON state, the cell current can flow through the memory cell MC of the memory pillar MP connected to the select transistor ST1 entering an ON state.

Figure 8:
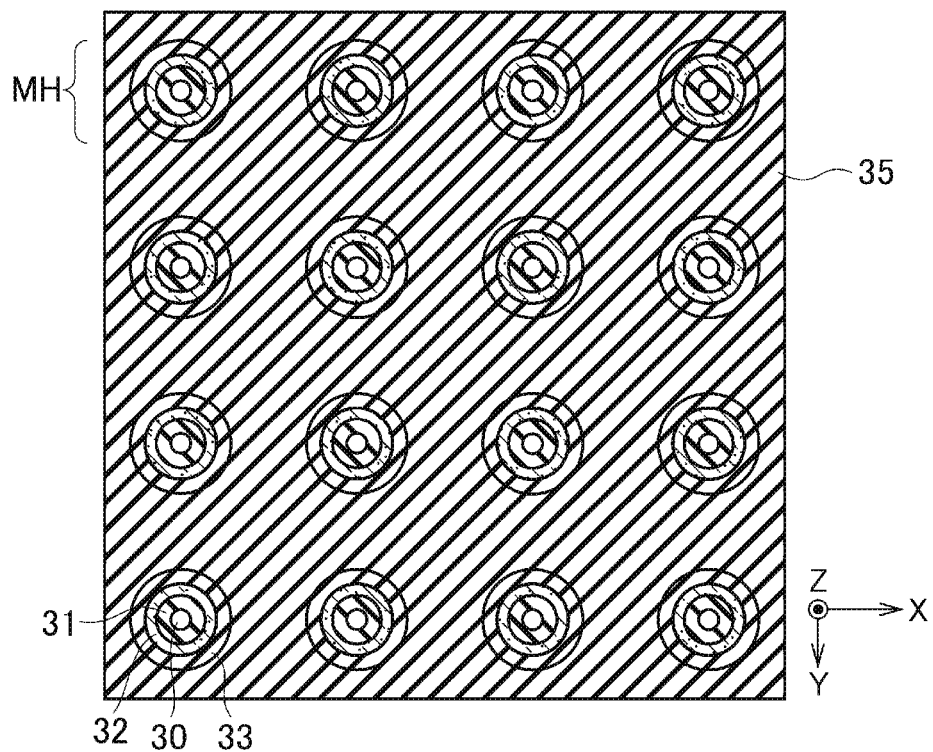
FIG. 8 illustrates a cross-section taken along line B1-B1 in FIG. 6.

Next, a plane pattern configuration of the memory cell MC seen from the Z direction will be described with reference to FIG. 8. As illustrated in FIG. 8, the core portion 30, the variable resistance layer 31, the semiconductor layer 32, and the insulator layer 33 are disposed in the memory hole MH penetrating the insulator layer 35. The variable resistance layer 31, the semiconductor layer 32, and the insulator layer 33 illustrated in FIG. 8 correspond to the memory cell MC viewed from the Z direction. In the cell transistor SW electrically connected, the cell current flows through the semiconductor layer 32.

Figure 9:
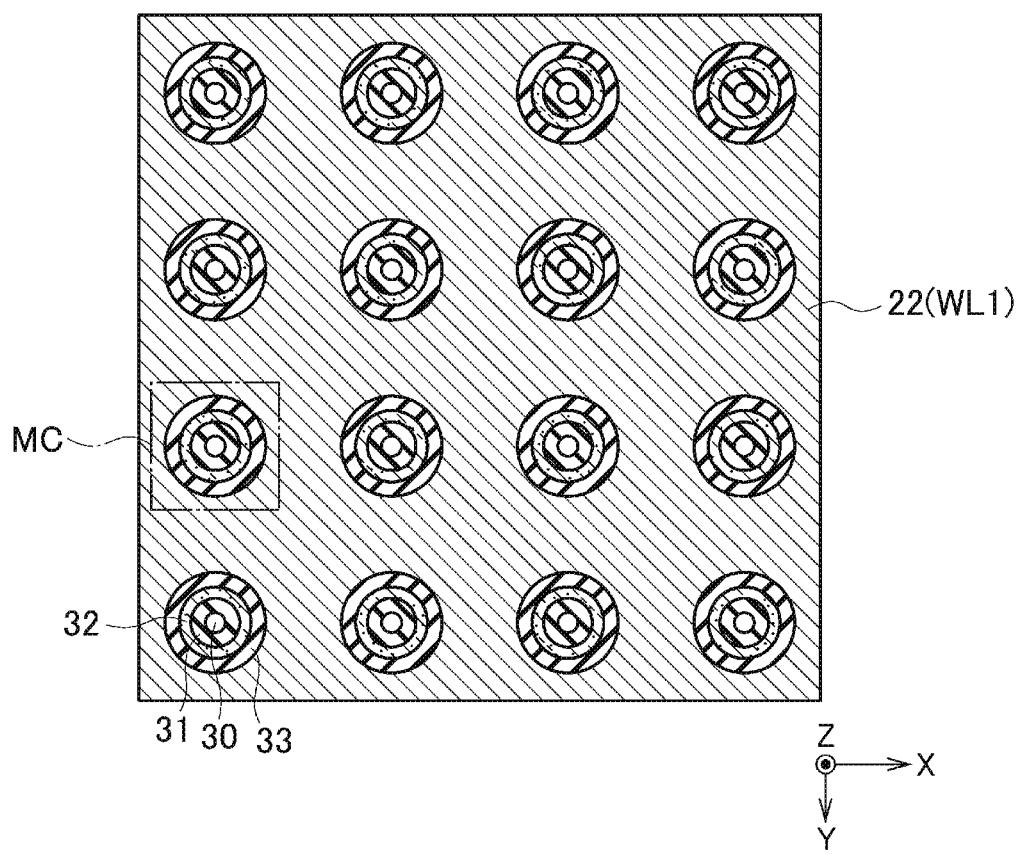
FIG. 9 illustrates a cross-section taken along line C1-C1 in FIG. 6.
Figure 10:
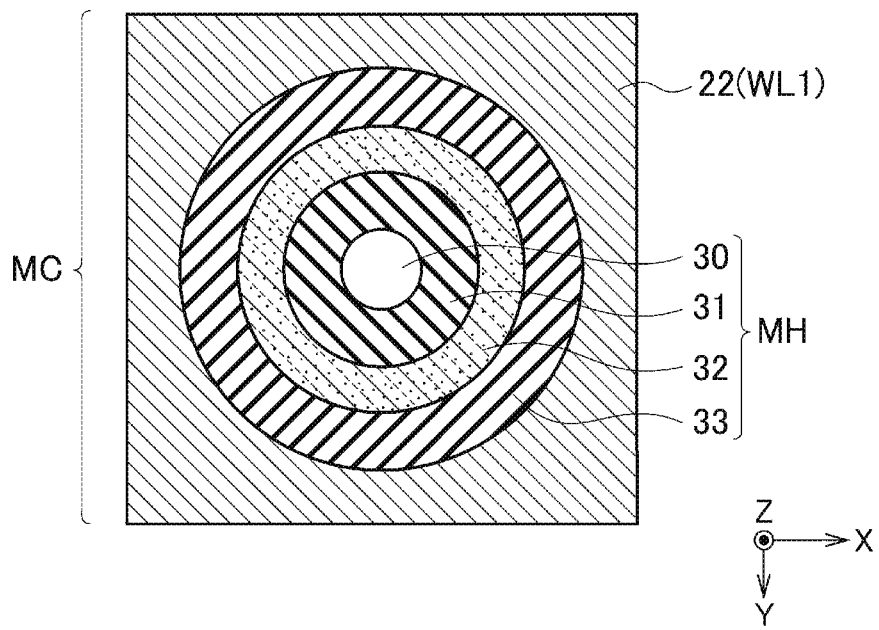
FIG. 10 is a cross-sectional view of one memory cell.

Next, a plane pattern configuration including the conductor layer 22 will be described with reference to FIGS. 9 and 10. FIG. 9 illustrates a cross-section taken along line C1-C1 in FIG. 6. FIG. 10 is a cross-sectional view of one memory cell MC depicted in FIG. 9.

As illustrated in FIGS. 9 and 10, the memory cell MC is disposed at the intersection of the plate-shaped word line WL and the memory pillar MP. Specifically, as illustrated in FIG. 10, the insulator layer 33, the semiconductor layer 32, the variable resistance layer 31, and the core portion 30 are disposed in the memory hole MH penetrating the conductor layer 22. The conductor layer 22 functions as a word line WL. The insulator layer 33 functions as a gate insulating film of the cell transistor SW of the memory cell MC, and the semiconductor layer 32 functions as a semiconductor layer of the cell transistor SW. The variable resistance layer 31 functions as a variable resistance memory region MR of the memory cell MC.

Figure 11:
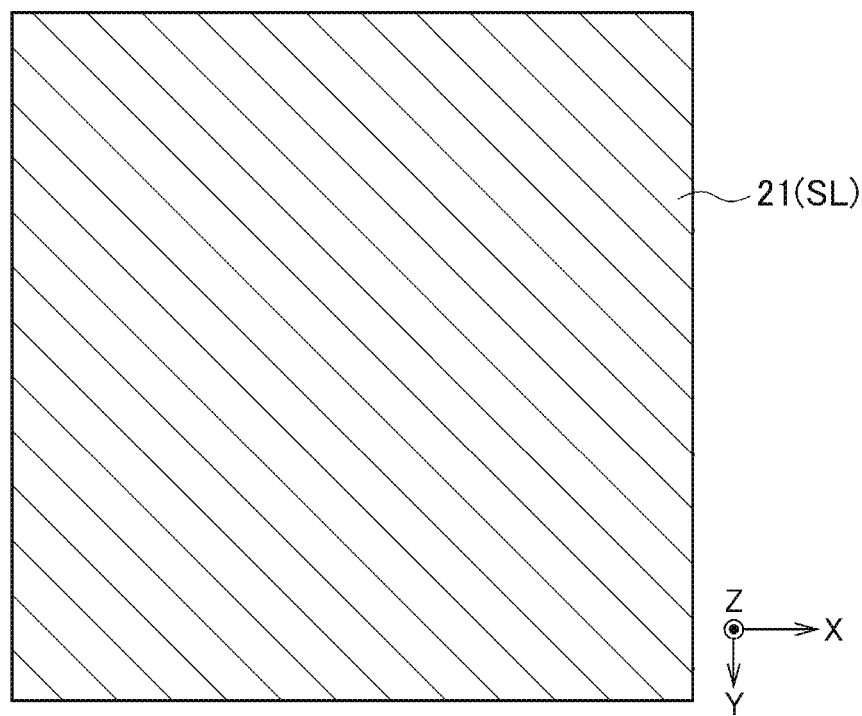
FIG. 11 illustrates a cross-section taken along line D1-D1 in FIG. 6.

FIG. 11 illustrates a plane pattern configuration including the conductor layer 21 that functions as a source line SL. The conductor layer 21 is set to a constant low voltage in order to allow the cell current to flow from the bit line BL via the memory string MS. As illustrated in FIG. 11, the conductor layer 21 has a plate shape like the conductor layer 22.

Figure 12:
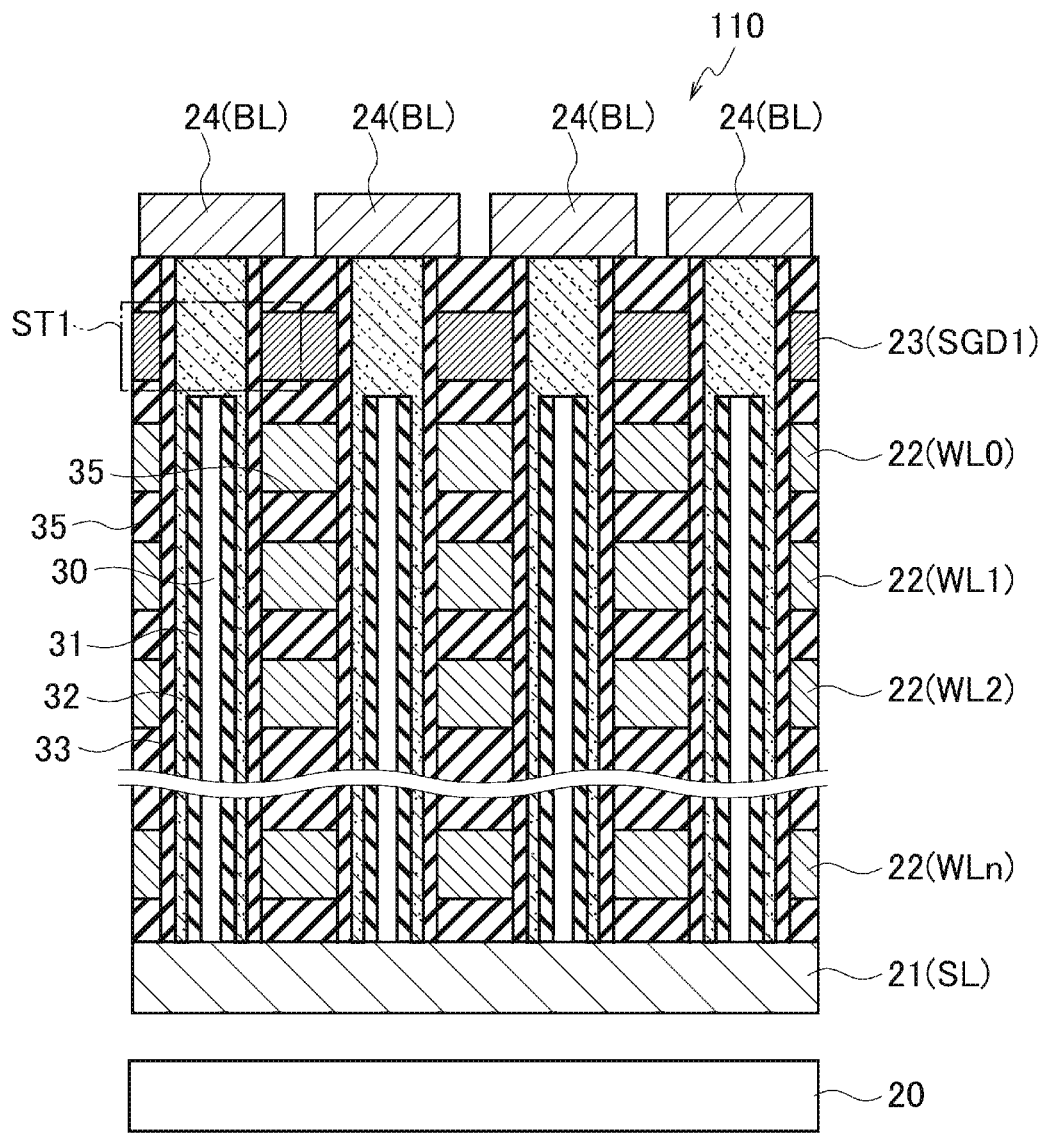
FIG. 12 illustrates a cross-section taken along line E1-E1 in FIG. 6.

FIG. 12 illustrates a cross-sectional structure of the memory cell array 110 in the direction perpendicular to FIG. 6. With reference to FIGS. 6 and 12, it can be seen that the memory pillar MP has a concentric shape centered on the core portion 30.

An outline of the operation of the memory chip 100 of the memory device according to the embodiment will be described below. The read operation and the write operation of the memory chip 100 are performed by allowing the cell current to flow between the bit line BL and the source line SL.

Figure 13:
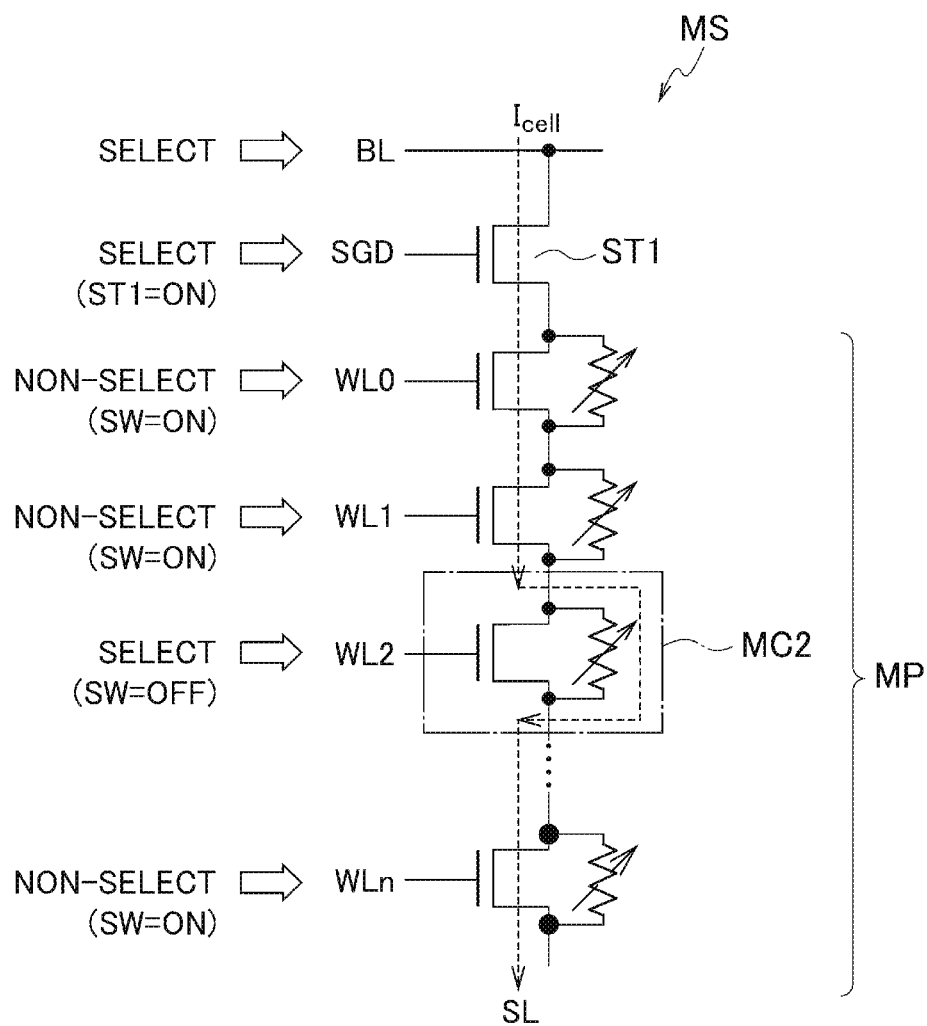
FIG. 13 is a circuit diagram of one memory string.
Figure 14:
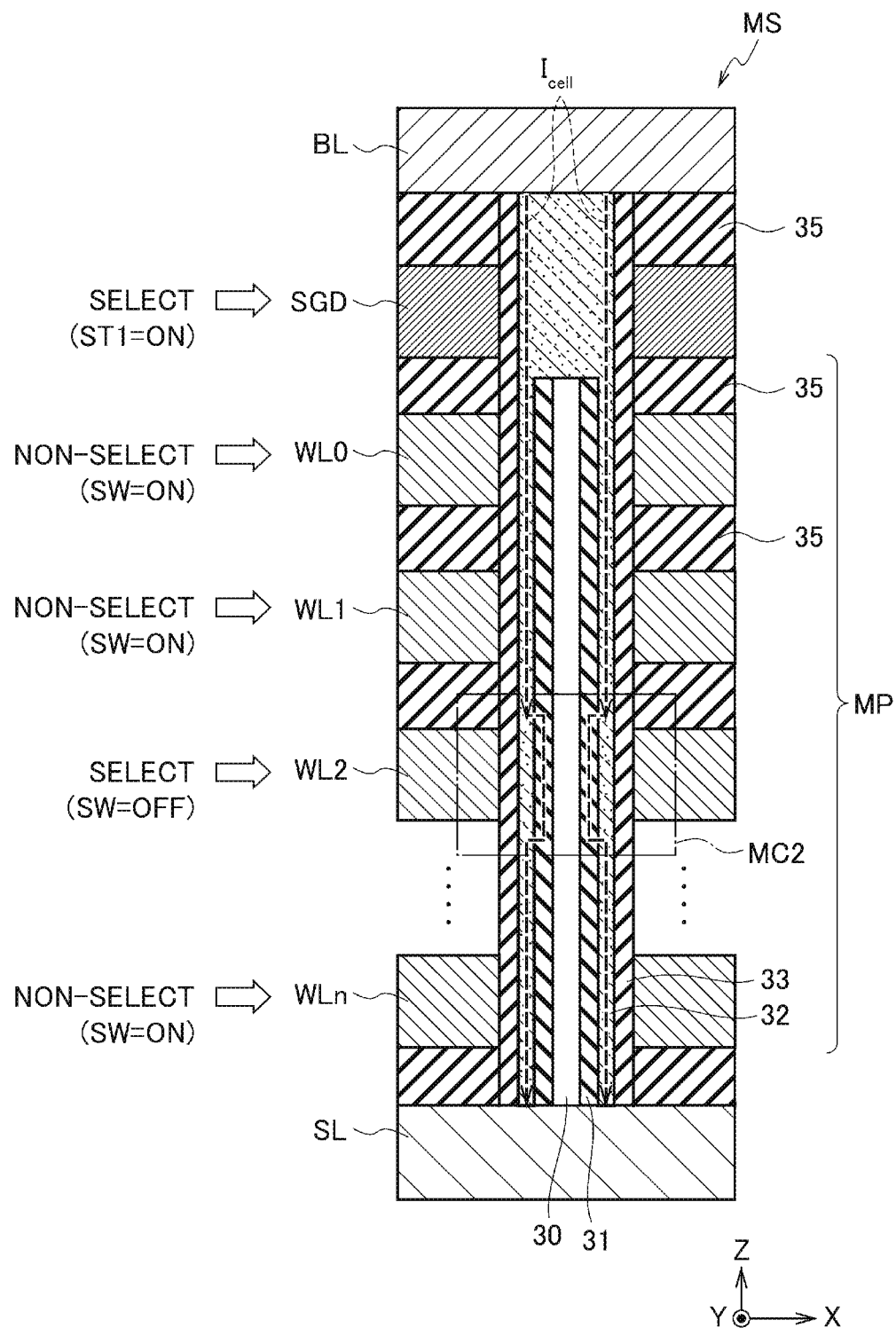
FIG. 14 is a schematic cross-sectional view of one memory string.

A method of selecting the memory cell MC to perform the read operation or the write operation will be schematically described with reference to FIGS. 13 and 14. FIG. 13 is a circuit diagram of one memory string MS. FIG. 14 is a cross-sectional view of one memory string MS.

As illustrated in FIGS. 13 and 14, a predetermined voltage (e.g., positive voltage) is applied to the select gate line SGD of the select transistor ST1 connected to the memory pillar MP to which the memory cell MC to be selected (for example, memory cell MC2) belongs. By applying the predetermined voltage to the select gate line SGD of the select transistor ST1, an inversion layer is formed in the semiconductor layer of the select transistor ST1. Accordingly, the cell current Icell can conduct the memory pillar MP to which the memory cell MC to be selected belongs (ON state).

Furthermore, a predetermined voltage (for example, −2 V) to turn off the cell transistor SW is applied to the word line WL2 of the selected memory cell MC2. On the other hand, a predetermined voltage (for example, +7 V) to turn on the cell transistor SW is applied to the word lines WL0, WL1, WL3, . . . , WLn of the non-selected memory cell MC. Accordingly, in the selected memory cell MC2, the cell current Icell flows through the variable resistance layer 31 that is the variable resistance memory region MR. On the other hand, in the non-selected memory cells MC0, MC1, MC3, . . . , MCn, the cell current Icell flows through the semiconductor layer 32 of the cell transistor SW. As illustrated in FIG. 14, since the core portion 30 is disposed in the central portion of the memory pillar MP, in the selected memory cell MC2, the cell current Icell flows through the variable resistance layer 31 surrounding the core portion 30.

As described above, in the memory chip 100, in the read operation and the write operation, the variable resistance layer 31 through which the cell current Icell flows can be selected. When the operation of the memory chip 100 is compared to that of a three-dimensional NAND type flash memory, the memory chip 100 has the advantages that the memory chip can operate at a lower voltage and higher speed, has less restriction on the number of rewrites, and obtains a shorter writing time.

As described above, the memory chip 100 has a configuration in which the memory cell MC connects the cell transistor SW and the variable resistance memory region MR in parallel. A semiconductor memory device which include variable resistance memory elements such as a variable resistance memory region MR is also referred to as a variable resistance memory.

Unlike the three-dimensional NAND type flash memory, the memory chip 100, which is a variable resistance memory, does not include an erasing operation.

In addition, the write operation or the read operation of the memory chip 100 is performed by allowing the select transistor ST1 to enter an ON state and allowing a cell current to flow between the bit line BL and the source line SL. For this reason, it is not necessary to select all the memory strings MS, and it is possible to select the memory strings MS in any bit line unit (e.g., column unit) connected to one selected select gate line SGD.

For the memory string MS on which the write operation and the read operation are not performed, for example, the voltage of the source line SL is set to the voltage of the bit line BL. In this manner, the write operation and the read operation are not performed on the non-selected memory cell MC.

In addition, in the memory chip 100, unlike the three-dimensional NAND type flash memory, it is not necessary to perform the erasing operation in units of a memory block BLK, and the write operation can be performed in units of a select transistor ST1.

The word line WL selects any memory cell MC in a stacking direction (Z direction). For this reason, the word line WL may be shared by the control gates of a plurality of memory cells MC in the same XY plane. In addition, the source line SL may also be shared by the plurality of memory strings MS. In particular, the source line SL may be shared by the plurality of memory strings MS adjacent to each other in the extending direction of the bit line.

The word line WL and the source line SL have a plate-like shape extending along the XY plane. In the memory chip 100, only one memory cell MC is selected for each bit line BL. The selection of the memory cell MC on the memory chip 100 is not performed unless a cell current is allowed to flow from the bit line BL to the source line SL in a state where the select transistor ST1 is in an ON state. For this reason, even if the word line WL and the source line SL having a plate shape are selected, only the memory cell MC connected to the selected word line WL directly under the bit line BL connected to the select transistor ST1 that enters an ON state is selected.

In the variable resistance memory, data recording is performed by using the difference in the values of the electric resistance of the variable resistance memory region MR. That is, the data recording is performed by the reset write that allows the variable resistance memory region MR to be in the high resistance reset state or by the set write that allows the variable resistance memory region MR to be in the low resistance set state.

As described above, a cell current is allowed to flow through the selected memory cell MC via the bit line BL. For this reason, the sequencer 170 is configured so as to be able to output control signals for performing the read operation on the bit line BL. The sequencer 170 can also output control signals for performing the reset write or the set write for each bit line BL.

As described above, in the variable resistance memory, a voltage is applied to the word line WL so that the cell transistor SW of the selected memory cell MC is in the OFF state and the cell transistor SW of the non-selected memory cell MC is in an ON state. In addition, in the variable resistance memory, a voltage at which the select transistor ST1 corresponding to the selected memory cell MC is turned ON is applied to the select gate line SGD. As used herein, the "select transistor ST1 corresponding to the selected memory cell MC" is the select transistor ST1 connected to the memory pillar MP to which the selected memory cell MC belongs. The select transistor ST1 is turned ON, so that the bit line BL and the memory pillar MP to which the selected memory cell MC belongs are allowed to be in a conductive state. The cell current Icell flows through the semiconductor layer 32 of the cell transistor SW in the non-selected memory cell MC and flows through the variable resistance memory region MR in the selected memory cell MC.

Figure 15:
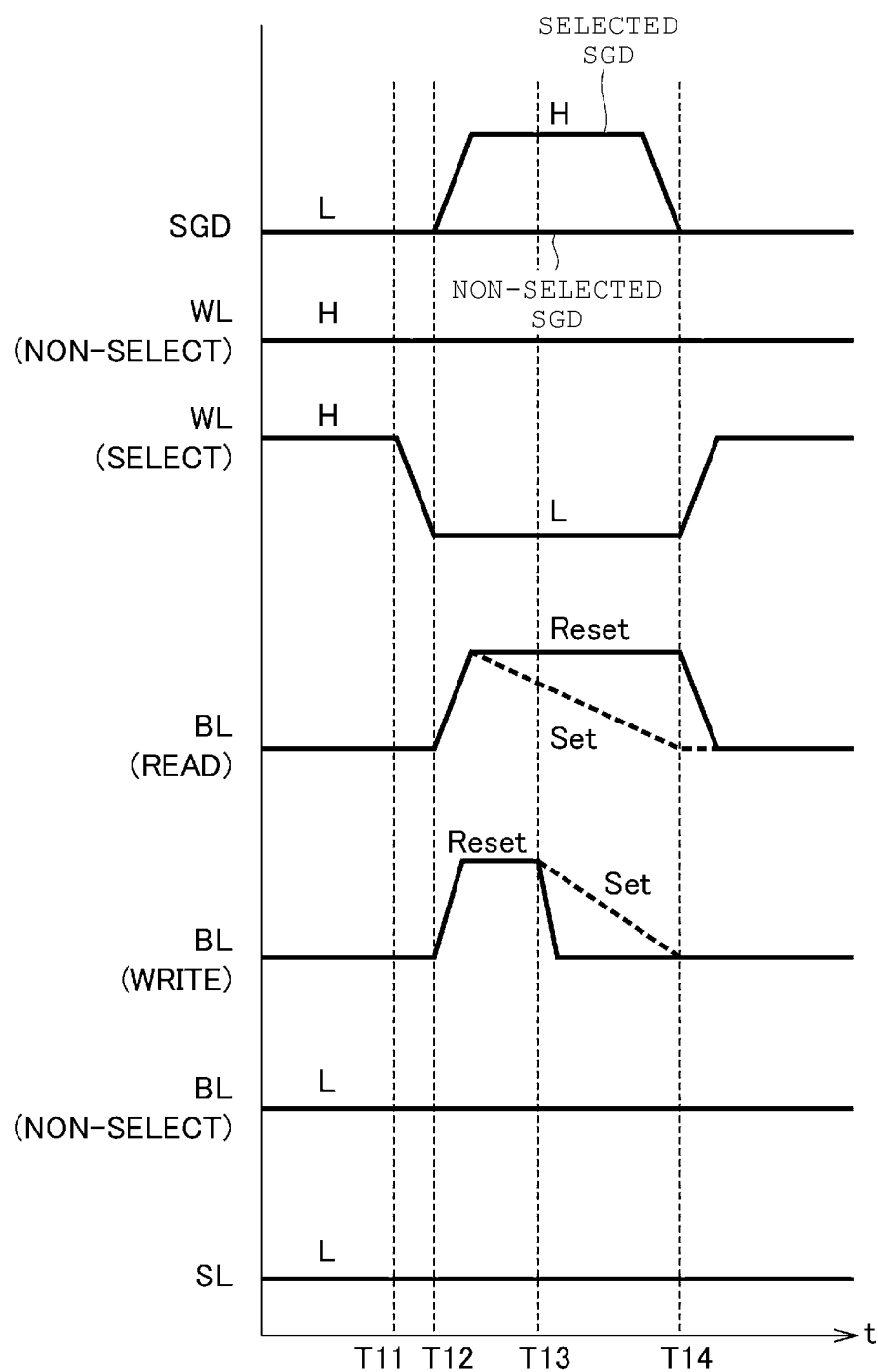
FIG. 15 illustrates a timing chart of an operating waveform of a memory device according to a comparative example.

FIG. 15 is a timing chart illustrating the operations of the variable resistance memory of a comparative example having the memory cell array 110 having the same configuration as the memory chip 100. The timing chart illustrated in FIG. 15 will be described below. In the following, the word line WL of the memory cell MC selected as a write target or a read target is also referred to as a "selected word line." (selected first voltage applying electrode)". That is, the selected word line is the first voltage applying electrode of the write target or the read target with which the selected memory cell MC is associated. The word line WL of the non-selected memory cell MC is also referred to as a "non-selected word line".

In addition, the bit line BL that is the write target or the read target connected to the select transistor ST1 corresponding to the selected memory cell MC is also referred to as a "selected bit line BL". The bit line BL connected to the select transistor ST1 corresponding to the non-selected memory cell MC is also referred to as a "non-selected bit line BL". In addition, the select gate line SGD of the select transistor ST1 corresponding to the selected memory cell MC is also described as a "selected SGD", and the select gate line SGD of each of the other select transistors ST1 is also described as a "non-selected SGD".

First, a case of the read operation will be described. In the following, the cell transistor SW is in the ON state when the voltage of the word line WL is at the H level, and the cell transistor SW is in the OFF state when the voltage of the word line WL is at the L level (H>L). In addition, the select transistor ST1 enters an ON state when the voltage of the select gate line SGD is at the H level, and the select transistor ST1 is in the OFF state when the voltage of the select gate line SGD is at the L level.

At the time T11 in FIG. 15, the sequencer 170 maintains the voltages of the non-selected bit line BL (NON-SELECT) and the source line SL at the L level. In addition, the sequencer 170 maintains the voltage of the non-selected word line (NON-SELECT) at the H level. At the time T11, the sequencer 170 starts decreasing the voltage of the selected word line (SELECT) from the H level and maintains the voltage of the selected word line at the L level after the time T12.

At the time T12, the sequencer 170 increases the voltage of the select gate line SGD from the L level to the H level. On the other hand, the voltage of the non-selected SGD is maintained at the L level. It is noted that, since the voltage of the non-selected word line is maintained at the H level, the cell transistor SW of the non-selected memory cell MC is maintained in the ON state.

Then, at the time T12, the sequencer 170 increases the voltage of the selected bit line BL (READ) that is the read target and is in a floating state after the time T12. Accordingly, when the variable resistance memory region MR of the selected memory cell MC is in the high resistance state (reset), the voltage of the selected bit line BL (READ) is slowly decreased, and as illustrated by the solid line, until the time T14, the voltage of the selected bit line BL is maintained at substantially the same level. On the other hand, when the variable resistance memory region MR of the selected memory cell MC is in the low resistance state (set), the voltage of the selected bit line BL (READ) is rapidly decreased as illustrated by the broken line. A voltage is applied to the selected bit line BL, and the "H level/L level" of the voltage of the bit line BL after a certain period of time is sensed by the sense amplifier 140 to perform the read operation.

Next, a case of the write operation will be described. The operation at the time T11 is the same as the read operation.

When the sequencer 170 applies a write pulse (voltage) to the selected bit line BL (WRITE) at the time T12 to rapidly decrease the voltage of the selected bit line BL from the time T13, reset write is performed so that the variable resistance memory region MR goes into the high resistance state. In addition, when the sequencer 170 applies a write pulse (voltage) to the selected bit line BL (WRITE) at the time T12 to slowly decreases the voltage of the selected bit line BL from the time T13, set write is performed so that the variable resistance memory region MR goes into the low resistance state. At this time, the voltage of the non-selected bit line BL (NON-SELECT) is maintained at the same voltage as the source line SL (for example, L level).

As described above, the memory cell MC is selected by applying a predetermined voltage to the bit line BL. If the voltage of the non-selected bit line BL is increased, the memory cell MC will be erroneously selected, and thus, erroneous write is formed. Therefore, the voltage may be selectively applied to the bit line BL corresponding to the memory cell MC to be read or written.

In the timing chart illustrated in FIG. 15, the voltage of the non-selected word line WL is maintained at a constant H level in the write operation. However, in order to increase the voltage of the selected bit line BL, the voltage of the non-selected word line may be further increased in the write operation in correspondence with the increase of the voltage of the selected bit line BL. By increasing the voltage of the non-selected word line, the cell transistor SW of the non-selected memory cell MC belonging to the memory string MS connected to the selected bit line BL can be reliably maintained in the ON state.

Figure 16:
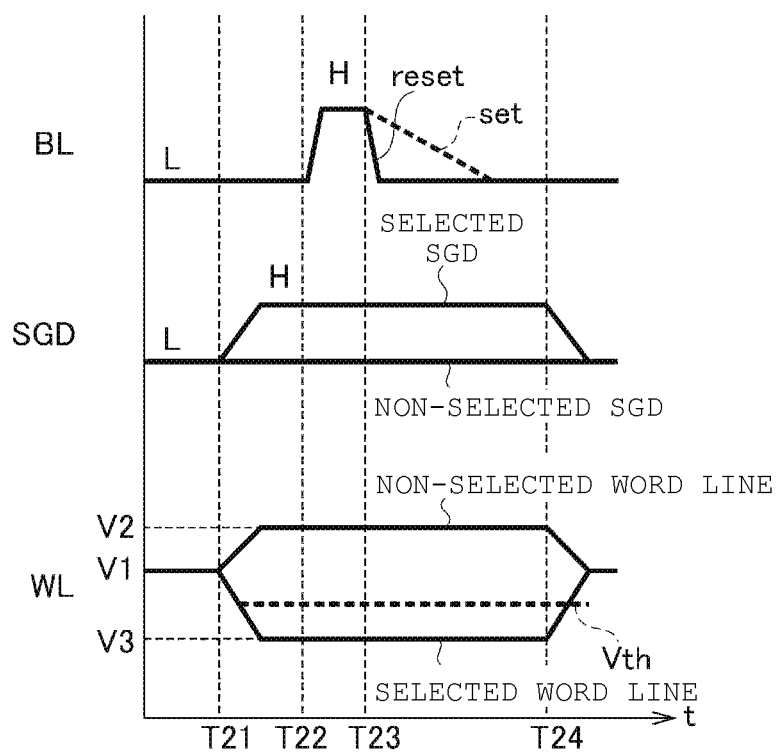
FIG. 16 illustrates a timing chart of another comparative example.

FIG. 16 illustrates an example of a timing chart of the operation of the memory device when the voltage of the non-selected word line is increased in correspondence with the increase of the voltage of the selected bit line BL in the write operation. In the following, the timing chart illustrated in FIG. 16 will be used as another comparative example. The timing chart of this comparative example will be described below.

At the time T21, the voltage of the selected SGD is increased from the L level (for example, −2 V) in which the select transistor ST1 is in the OFF state to the H level (for example, +7 V) so that the select transistor ST1 enters an ON state. On the other hand, the voltage of the non-selected SGD is maintained at the L level.

In addition, at the time T21, the voltage of the selected word line is decreased from a first voltage V1 (for example, +4 V) to a third voltage V3 of L level (for example, −2 V), and the voltage of the non-selected word line is increased from the first voltage V1 to a second voltage V2 of the H level (for example, +7 V). The first voltage V1 is a voltage of the word line WL in a standby state in which the memory chip 100 does not perform operations such as a write operation and a read operation. The first voltage V1 is a voltage at which the cell transistor SW enters an ON state. The third voltage V3 is a voltage lower than a threshold voltage Vth of the cell transistor SW and is a voltage at which the cell transistor SW is in the OFF state. The second voltage V2 is a voltage at which the cell transistor SW is reliably maintained in the ON state even when the voltage of the selected bit line BL is at the H level in the write operation.

After the transition of each voltage at the time T21 is completed, the voltage of the selected bit line BL is increased from the L level (for example, 0 V) to the H level (for example, +4 V) at the time T22. After that, when the voltage of the selected bit line BL is rapidly decreased from the time T23, reset write is performed in which the variable resistance memory region MR is in a high resistance reset state (reset). In addition, when the voltage of the selected bit line BL is slowly decreased from the time T23, set write is performed in which the variable resistance memory region MR is in a low resistance set state (set).

After the transition of the voltage of the selected bit line BL is completed, the voltage of the selected SGD is decreased from the H level to the L level at the time T24. In addition, at the time T24, the voltage of the selected word line is increased from the third voltage V3 to the first voltage V1, and the voltage of the non-selected word line is decreased from the second voltage V2 to the first voltage V1.

In the timing chart of the comparative example described above, when the select transistor ST1 corresponding to the selected memory cell MC enters an ON state, the cell transistor SW of the selected memory cell MC is in the OFF state, and the cell transistor SW of the non-selected memory cell MC enters an ON state. Accordingly, by allowing the cell current Icell to flow through the variable resistance memory region MR of the selected memory cell MC, the variable resistance memory region MR is heated to a high temperature, so that the write operation is performed. By setting the voltage of the non-selected word line to be set to the second voltage V2 higher than the first voltage V1, even when the voltage of the selected bit line BL is set to be at the H level, the cell transistor SW of the non-selected memory cell MC is maintained in the ON state.

However, in the write operation according to the timing chart of the comparative example illustrated in FIG. 16, there is a possibility of data disturbance (data destruction) in which writing of data is performed in the non-selected memory cell MC that is not the write target may occur as described below. An erroneous write operation to the non-selected memory cell MC will be described with reference to FIG. 17.

Figure 17:
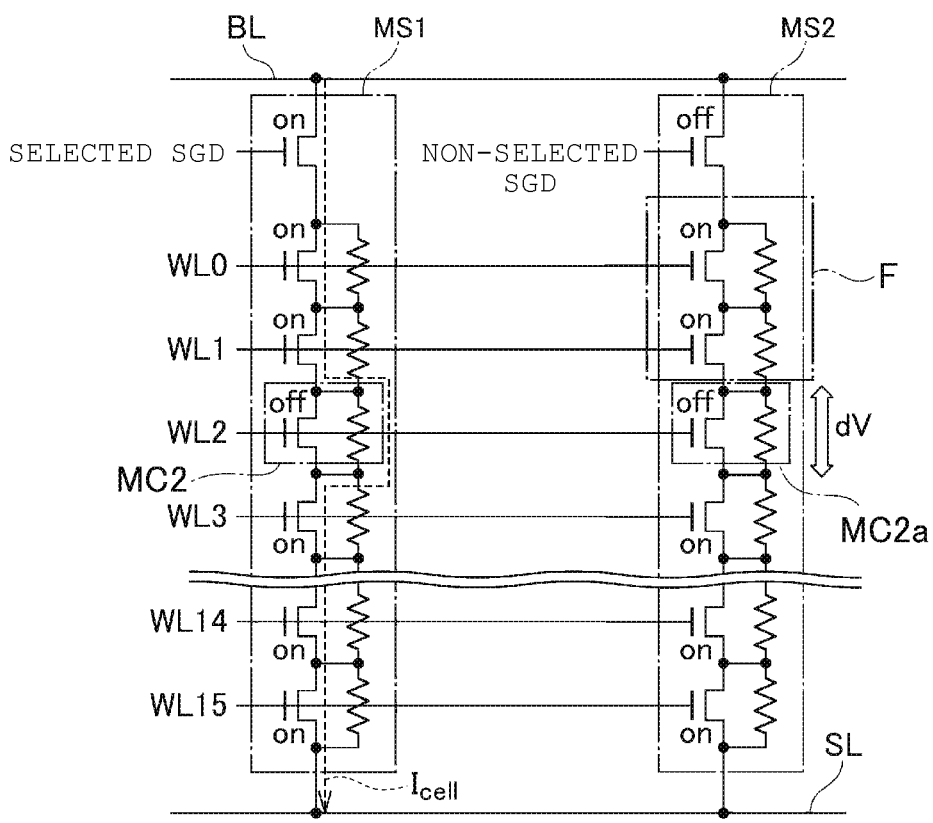
FIG. 17 is a circuit diagram illustrating an erroneous write occurring in a memory device.

FIG. 17 is a circuit diagram illustrating a configuration in which the first memory string MS1 and the second memory string MS2 are connected in parallel between the selected bit line BL and the source line SL. The word line WL of the first memory string MS1 and the word line WL of the second memory string MS2 are common. Herein, a case where the memory cell MC2 associated with the word line WL2 of the first memory string MS1 is selected will be examined.

When the memory cell MC2 is selected, the cell transistor SW of the memory cell MC2 is in the OFF state. Then, in the first memory string MS1, the cell transistors SW of all the other memory cells MC except for the select transistor ST1 and the memory cell MC2 enter an ON state. Then, the cell current Icell flows through the cell transistor SW of each of the other memory cells MC except for the memory cell MC2, and through the variable resistance memory region MR of the memory cell MC2. In this manner, writing to the memory cell MC2 is performed.

On the other hand, in the second memory string MS2, since the select transistor ST1 is in the OFF state, the cell current Icell does not flow. However, when the voltage of the selected word line is decreased below the threshold voltage Vth of the cell transistor SW in the process of decreasing the voltage of the selected word line from the time T21 in FIG. 16, the cell transistor SW of a memory cell MC2a associated with the word line WL2 of the second memory string MS2 is in the OFF state. For this reason, in the second memory string MS2, the memory cell MC connected between the select transistor ST1 in the OFF state and the memory cell MC2a in the OFF state is connected to the source line SL via the variable resistance memory region MR but is almost in the floating state. FIG. 17 illustrates a floating-state region surrounded by a broken line F.

The voltage of the floating-state region is determined by coupling capacitance with the surroundings. For this reason, since the voltage of the non-selected word line is increased after the cell transistor SW of the memory cell MC2a is in the OFF state, the voltage of the floating-state region is increased. Hereinafter, the change in the voltage of the floating-state region due to the coupling capacitance is referred to as a "boost". As a result of the voltage of the floating-state region being increased due to the boost, a voltage difference dV occurs at both ends of the variable resistance memory region MR of the memory cell MC2a. Due to the voltage difference dV, a current flows through the variable resistance memory region MR, and thus, the erroneous write to the memory cell MC2a of the non-selected second memory string MS2 is performed.

Hereinafter, the memory cell MC belonging to the non-selected memory string MS and associated with the selected word line is also referred to as a "falsely selected memory cell". In the circuit diagram illustrated in FIG. 17, the memory cell MC2a of the second memory string MS2 is the falsely selected memory cell. The memory cell MC that is in the floating state in the write operation is the memory cell MC connected between the select transistor ST1 of the non-selected memory string MS and the falsely-selected memory cell. Then, due to the boost, erroneous write (also referred to herein as data disturbance) is performed to the falsely selected memory cell.

In the above, the erroneous write caused by the boost at the time of the start of the write operation has been described, but the same applies at the time of the end of the write operation. That is, when the voltage of the non-selected word line is fluctuated during the period when the voltage of the selected word line is lower than the threshold voltage Vth of the cell transistor SW, erroneous write in the falsely selected memory cell occurs due to local boost.

On the other hand, in the memory device according to the embodiment, the voltage setting circuit 130 adjusts the timing at which the voltage is set for each word line WL as follows, so that the erroneous write in the non-selected memory cell MC by the local boost can be prevented.

The voltage setting circuit 130 sets the voltage of the selected word line and the voltage of the non-selected word line at different timings in the write operation. Hereinafter, the non-selected word line that is the target of which the voltage is allowed to be set at the timing different from that of the selected word line is also referred to as a "set non-selected word line". The set non-selected word line includes at least the non-selected word line associated with the memory cell MC that is in the floating state described above. That is, the set non-selected word line includes at least the non-selected word line associated with the memory cell MC that is connected between the select transistor ST1 of the non-selected memory string MS and the falsely-selected memory cell.

Specifically, at the time of the start of the write operation, before setting the voltage of the selected word line to the voltage at which the cell transistor SW is in the OFF state, the voltage setting circuit 130 sets the set non-selected word line to a voltage at which the cell transistor SW is maintained in the ON state. Furthermore, at the time of the end of the write operation, after setting the voltage of the selected word line to the voltage before the write operation, the voltage setting circuit 130 sets the voltage of the set non-selected word line to the voltage before the write operation. The voltage at which the cell transistor SW is in the OFF state is, for example, the threshold voltage of the cell transistor SW.

A method of setting the voltage of the word line WL by the memory device according to the embodiment will be described with reference to FIG. 18.

At the time T31 (first timing), all of the word lines WL are set to the first voltage V1. The first voltage V1 is a voltage at which the cell transistor SW enters an ON state, and is, for example, +4 V.

Next, at the time T32 (second timing) after the time T31, the set non-selected word line is set to the second voltage V2 at which the cell transistor SW is maintained in the ON state. The second voltage V2 is a voltage at which the cell transistor SW is maintained in the ON state even in a state where the voltage of the selected bit line BL is increased in the write operation and is, for example, 7 V. In addition, at the time T32, the voltage of the selected SGD is set from the L level (for example, −2 V) in which the select transistor ST1 is in the OFF state to the H level (for example, +7 V) in which the select transistor ST1 enters an ON state. On the other hand, the voltage of the non-selected SGD is maintained at the L level.

Then, at the time T33 (third timing) after the time T32, the selected word line is set to the third voltage V3 in which the cell transistor SW is in the OFF state. The third voltage V3 is a voltage lower than the threshold voltage Vth of the cell transistor SW and is, for example, −2 V. When the voltage of the selected word line is decreased below the threshold voltage Vth of the cell transistor SW in the process of decreasing the voltage of the selected word line from the first voltage V1 to the third voltage V3, the cell transistor SW of the selected memory cell MC is in the OFF state. When the cell transistor SW is in the OFF state, a current flows through the variable resistance memory region MR of the selected memory cell MC in the subsequent write operation.

In the write operation, the voltage of the selected bit line BL is set from the L level (for example, 0 V) to the H level (for example, +4 V). After that, when the voltage of the selected bit line BL is rapidly decreased, reset write is performed as a result of which the variable resistance memory region MR goes into a high resistance (reset) state. On the other hand, when the voltage of the selected bit line BL is slowly decreased, set write is performed as a result of which the variable resistance memory region MR goes into a low resistance (set) state.

After the write operation for the selected memory cell MC is executed, at the time T34 (fourth timing) after the time T33, the selected word line is set to the first voltage V1. Next, at the time T35 (fifth timing) after the time T34, the set non-selected word line is set to the first voltage V1. In addition, the voltage of the selected SGD is set from the H level to the L level.

According to the method of setting the voltage of the word line WL described above with reference to FIG. 18, at the time of the start of the write operation, the voltage of the selected word line starts to be decreased after the voltage of the set non-selected word line is increased. Furthermore, at the time of the end of the write operation, after the voltage of the selected word line is increased, the voltage of the set non-selected word line starts to be decreased. For this reason, the local boost does not occur, and erroneous writing in the falsely selected memory cell is prevented.

Figure 18:
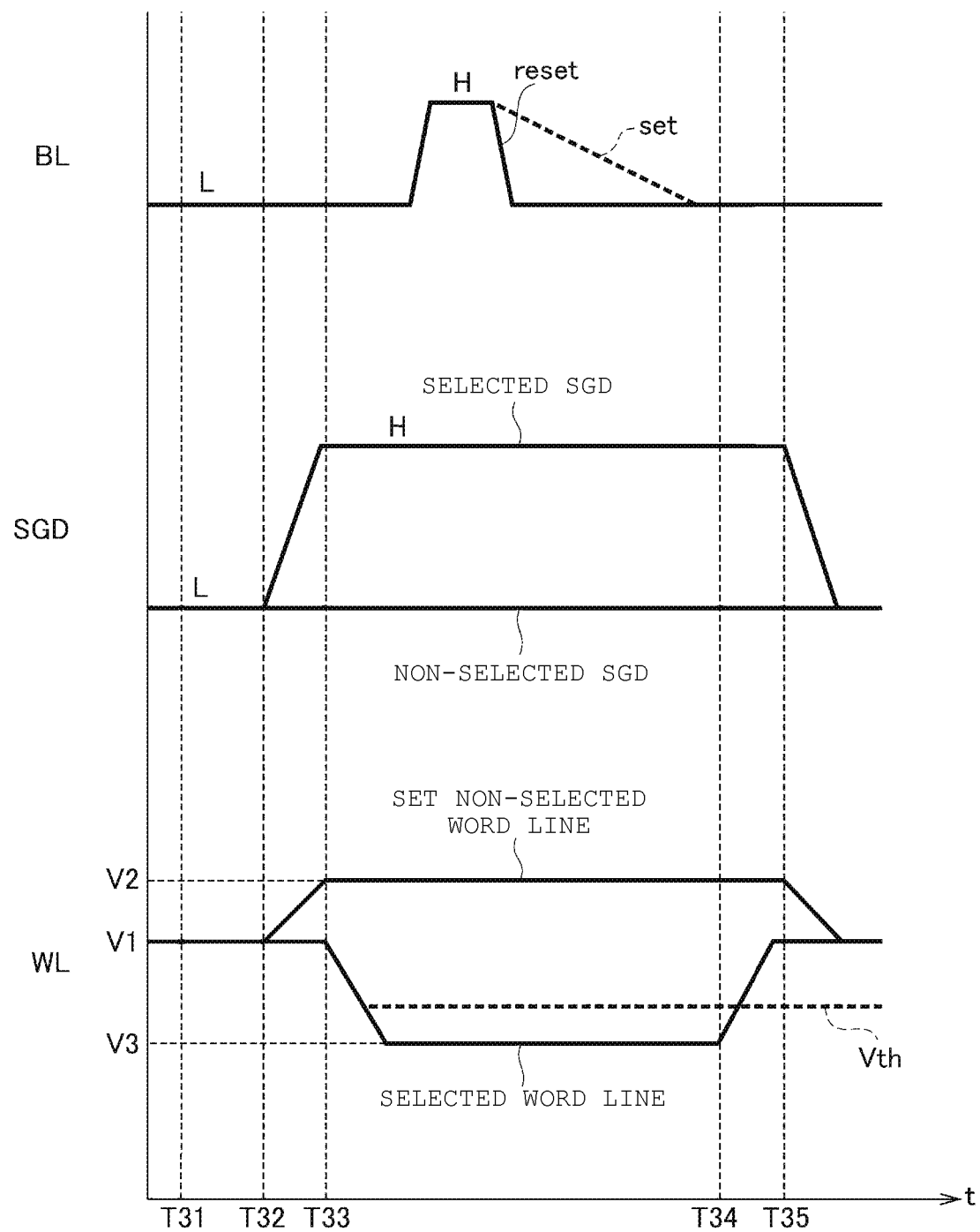
FIG. 18 illustrates a timing chart of an operation waveform of a memory device according to the embodiment.

The method of setting the voltage of the word line WL described with reference to FIG. 18 is executed by using, for example, the voltage setting circuit 130 illustrated in FIG. 19. The voltage generating circuit 131 of the voltage setting circuit 130 illustrated in FIG. 19 has a first variable power supply 1311 and a second variable power supply 1312. The first variable power supply 1311 and the second variable power supply 1312 are power supplies of which output voltages are variable. The first variable power supply 1311 generates a voltage in the range of the first voltage V1 to the second voltage V2 to be supplied to the non-selected word line. The second variable power supply 1312 generates a voltage in the range of the first voltage V1 to the third voltage V3 to be supplied to the selected word line.

Figure 19:
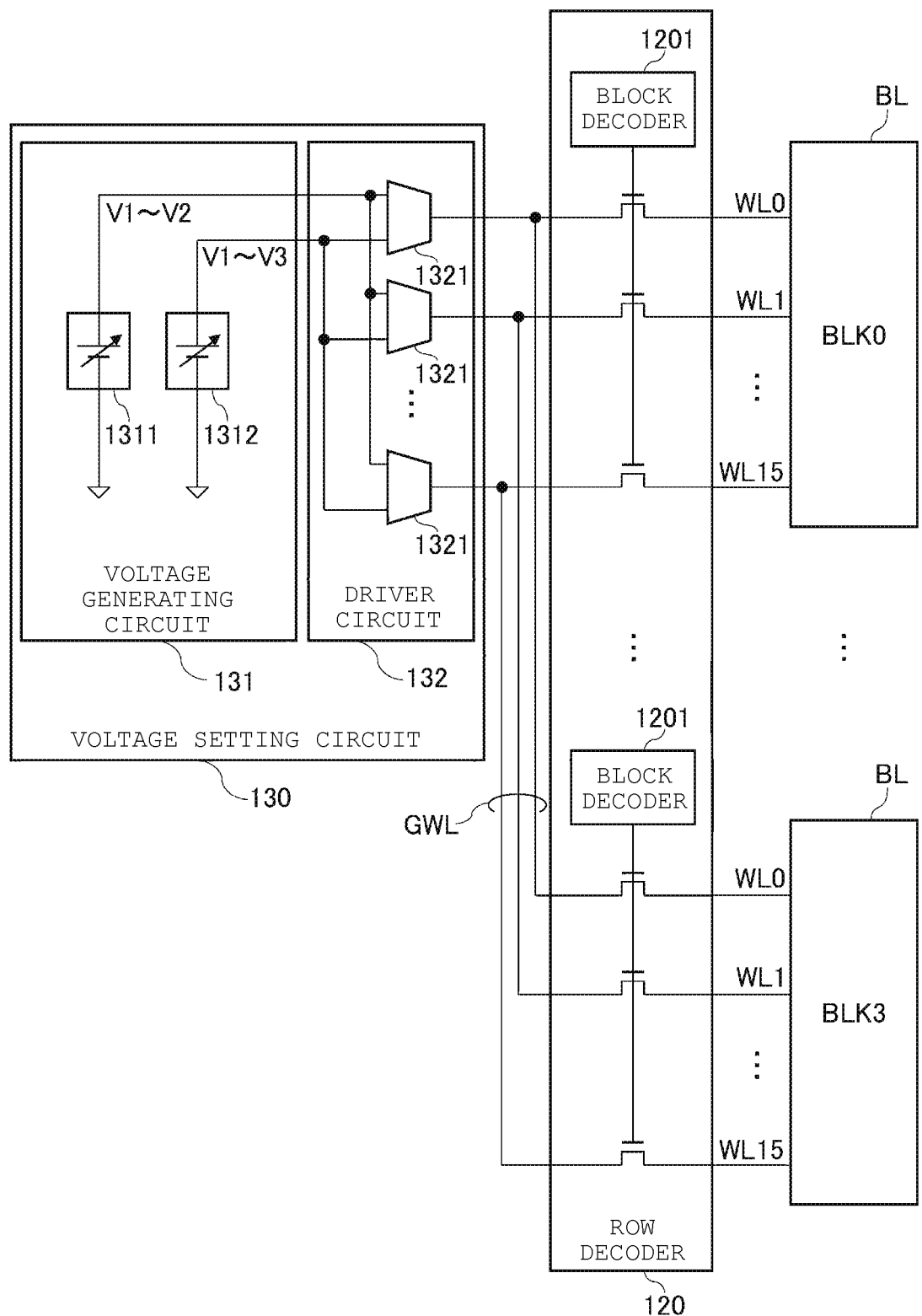
FIG. 19 is a block diagram illustrating a voltage setting circuit of the memory device according to the embodiment.

The driver circuit 132 of the voltage setting circuit 130 illustrated in FIG. 19 supplies the voltage generated by the voltage generating circuit 131 to the word line WL of the memory cell array 110 via the row decoder 120. The driver circuit 132 has a selector 1321 that selects any one of the voltage generated by the first variable power supply 1311 and the voltage generated by the second variable power supply 1312 and supplies the voltage to the row decoder 120. The selector 1321 supplies the voltage generated by the first variable power supply 1311 to the non-selected word line, and supplies the voltage generated by the second variable power supply 1312 to the selected word line.

The output of the selector 1321 is input to the row decoder 120 via a global word line GWL corresponding to the word line WL of the memory block BLK (for example, the memory blocks BLK0 to BLK3) of the memory cell array 110. The row decoder 120 controls the supply of voltage to the word line WL for each memory block BLK by a block decoder 1201.

The voltage setting circuit 130 illustrated in FIG. 19 simultaneously supplies the voltage to all the non-selected word lines of the selected memory block BLK. That is, in the memory chip 100 having the voltage setting circuit 130 illustrated in FIG. 19, the set non-selected word line includes all the word lines WL except for the selected word lines of the selected memory block BLK.

Figure 20:
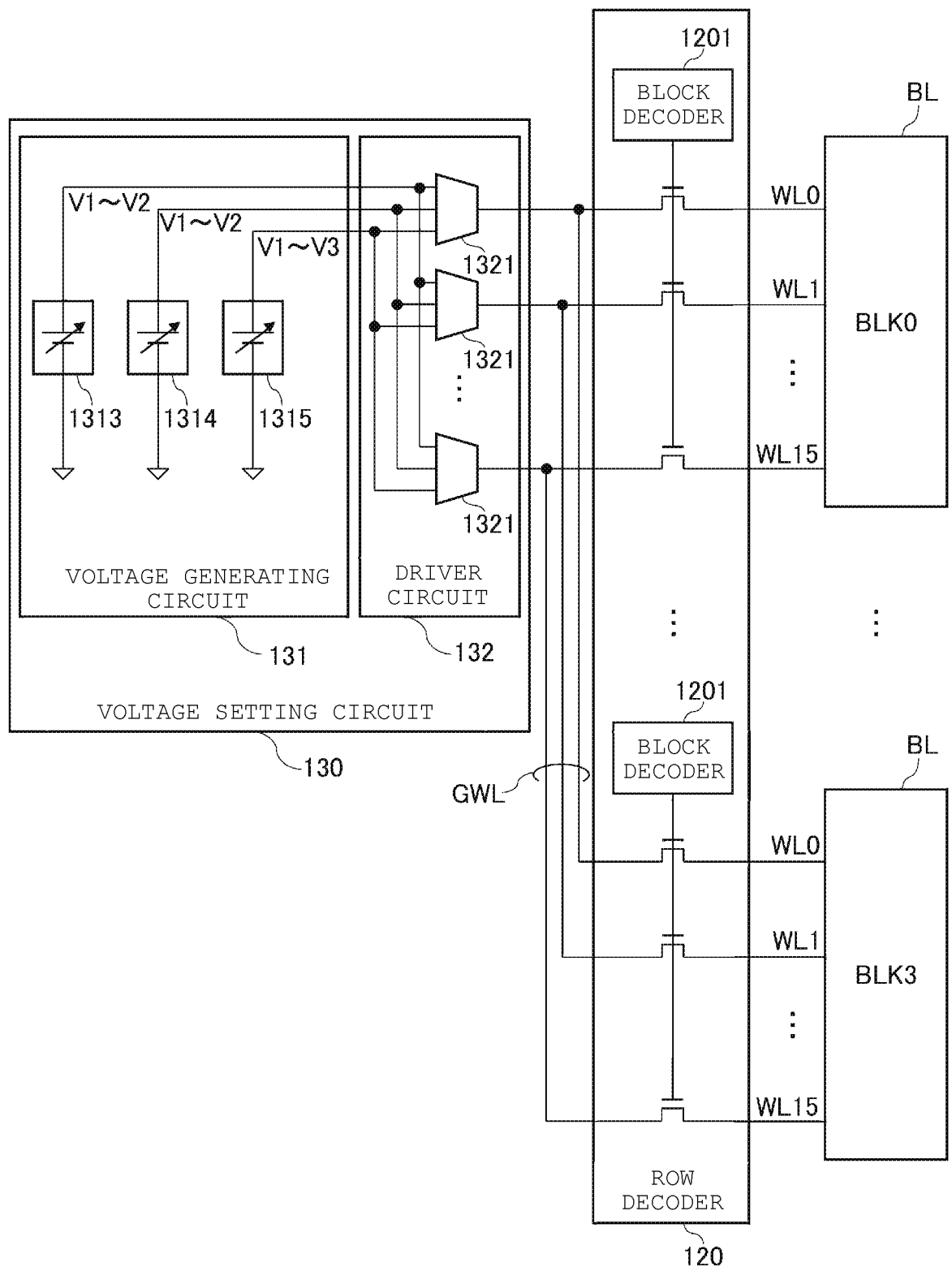
FIG. 20 is a block diagram illustrating another voltage setting circuit of the memory device according to the embodiment.

Alternatively, the voltage setting circuit 130 may have a configuration illustrated in FIG. 20. In the voltage setting circuit 130 illustrated in FIG. 20, the voltage generating circuit 131 includes an upper non-selected word line power supply 1313, a lower non-selected word line power supply 1314, and a selected word line power supply 1315.

The upper non-selected word line power supply 1313 supplies a voltage to the non-selected word line (upper non-selected word line) to which the memory cell MC connected between the falsely selected memory cell and the select transistor ST1 is associated. The lower non-selected word line power supply 1314 supplies a voltage to the non-selected word line (lower non-selected word line) to which the memory cell MC connected between the falsely-selected memory cell and the source line SL is associated. The upper non-selected word line power supply 1313 and the lower non-selected word line power supply 1314 output a voltage in the range of the first voltage V1 to the second voltage V2. The selected word line power supply 1315 outputs a voltage in the range of the first voltage V1 to the third voltage V3 supplied to the selected word line.

The driver circuit 132 illustrated in FIG. 20 selects any one of the voltage generated by the upper non-selected word line power supply 1313, the voltage generated by the lower non-selected word line power supply 1314, and the voltage generated by the selected word line power supply 1315 and supplies the voltage to the row decoder 120. The selector 1321 of the row decoder 120 supplies the voltage generated by the upper non-selected word line power supply 1313 to the upper non-selected word line and supplies the voltage generated by the lower non-selected word line power supply 1314 to the lower non-selected word line. Then, the selector 1321 supplies the voltage generated by the selected word line power supply 1315 to the selected word line. The row decoder 120 controls the supply of voltage to the word line WL for each memory block BLK by the block decoder 1201.

The set non-selected word line includes the upper non-selected word lines, and the lower non-selected word line includes non-selected word lines except for the set non-selected word lines. According to the voltage setting circuit 130 illustrated in FIG. 20, the voltage of the set non-selected word line and the voltage of each of the other non-selected word lines can be controlled independently. For example, the voltage setting circuit 130 can supply different voltages or supply voltages at different timings to the set non-selected word lines and the other non-selected word lines.

As described above, in the method of setting the voltage of the word line WL by the memory device according to the embodiment, at the time of the start of the write operation, the selected memory cell MC is set to be in the OFF state after the transition of the voltage of the set non-selected word line is completed. Furthermore, in the above-mentioned method of setting the voltage of the word line WL, the device transitions to the voltage of the set non-selected word line after the selected memory cell MC enters an ON state at the time of the end of the write operation. For this reason, according to the memory device according to the embodiment, the local boost does not occur, and erroneous write in the non-selected memory cell MC can be prevented.

Modified Example

Figure 21:
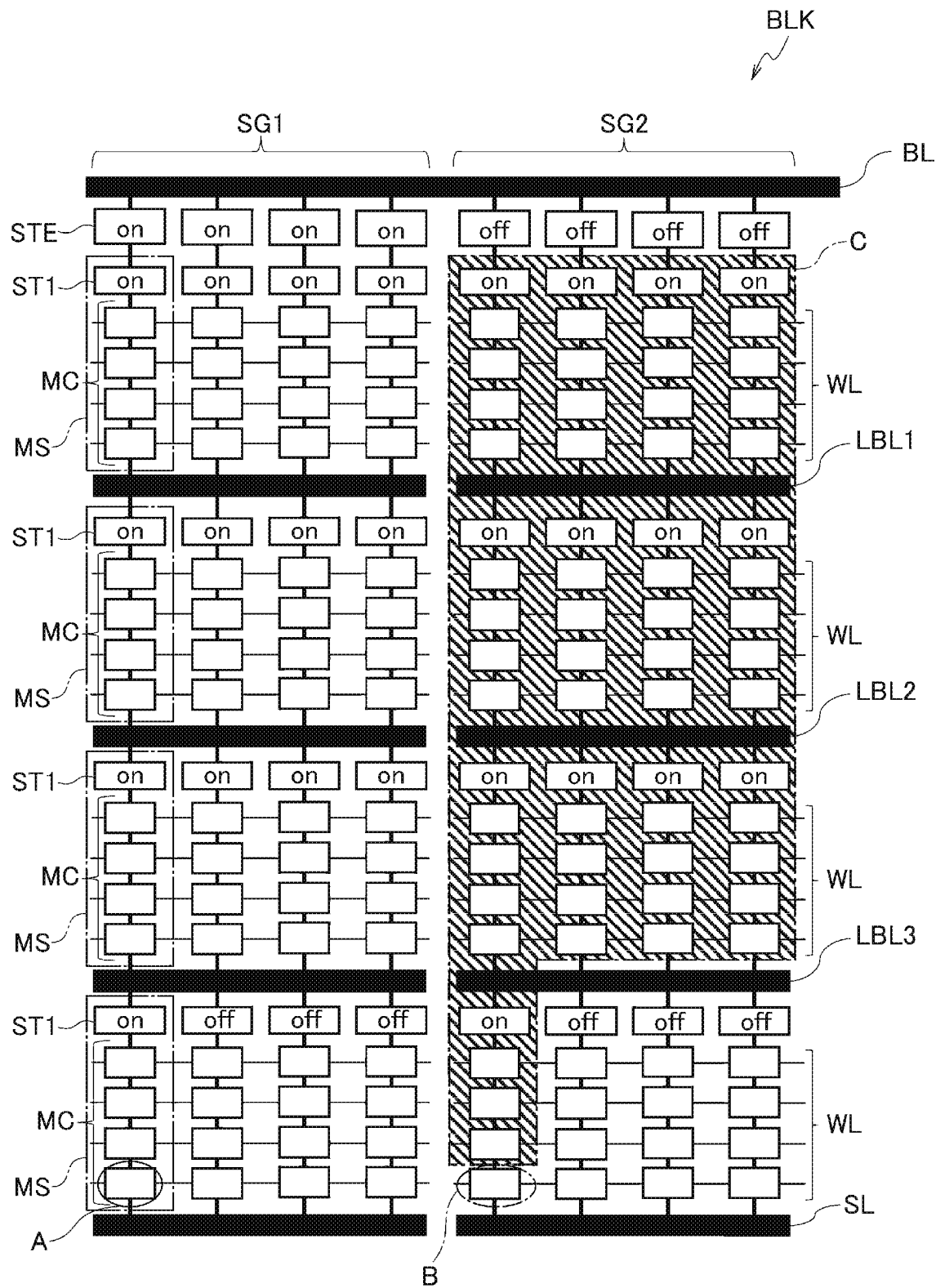
FIG. 21 is a block diagram illustrating a configuration of a memory block of a memory device according to a modified example of the embodiment.

As illustrated in FIG. 21, for example, a memory device according to a modified example of the embodiment has a configuration (hereinafter, also referred to as a "segmented configuration") in which each of the memory blocks BLK of the memory cell array 110 has a plurality of segments including the plurality of memory strings MS. The memory block BLK illustrated in FIG. 21 has a first segment SG1 and a second segment SG2.

In the memory block BLK having a segmented configuration, the memory string MS belongs to any one of the plurality of segments. Then, the memory string MS belonging to any one of the segments is selectively connected to the bit line BL. That is, the select transistor ST1 of the memory string MS belonging to one segment is selectively connected to the bit line BL, and the select transistor ST1 of the memory string MS belonging to each of the other segments is not connected to the bit line BL. Each of the segments is configured with the plurality of memory strings MS at the same time as the select transistor ST1 is connected to the bit lines BL.

In the memory device including the memory block BLK having a segmented configuration, the write operation and the read operation for the memory cell MC are managed in units of a segment. By employing the segmented configuration, the range of the memory cell MC sharing the word line WL can be expanded.

The memory block BLK having a segmented configuration has a connection device for selectively connecting any one of the segments and the bit line BL. The memory block BLK illustrated in FIG. 21 has a segment transistor STE as a connection device. The segment transistor STE is connected between each of the plurality of memory strings MS having a common bit line BL and the bit line BL. The memory string MS that is connected to the bit line BL is selected in units of a segment by the segment transistor STE.

In the segment containing the selected memory cell MC, the segment transistor STE disposed between the bit line BL and the memory string MS enters an ON state. On the other hand, in the segment not including the selected memory cell MC, the segment transistor STE disposed between the bit line BL and the memory string MS is in the OFF state. The segment transistor STE is a MOS transistor of which ON/OFF state is controlled by, for example, a voltage applied to a gate line (hereinafter, also referred to as an "SEG") connected to a control gate of the segment transistor STE.

In FIG. 21, the segment transistor STE connected to the select transistor ST1 is different for each memory string MS. However, the segment transistors STE connected to the plurality of memory strings MS belonging to the same segment may be replaced with one common segment transistor.

The memory cell MC selected in FIG. 21 is the memory cell MC that belongs to the first segment SG1 and is connected to the source line SL and that is illustrated so as to be surrounded a broken line A. For this reason, in the first segment, the segment transistor STE enters an ON state. On the other hand, in the second segment that does not include the selected memory cell MC, the segment transistor STE is in the OFF state. Therefore, in the first segment SG1, the cell current flows from the bit line BL to the source line SL, but in the second segment SG2, the cell current does not flow from the bit line BL to the source line SL. In FIG. 21, the segment transistor STE and the select transistor ST1 that enter an ON state are displayed as "ON", and the segment transistor STE and the select transistor ST1 that are in the OFF state are displayed as "OFF".

In addition, the memory block BLK illustrated in FIG. 21 has local bit lines LBL1 to LBL3. Hereinafter, when the description is not limited to one of the local bit lines LBL1 to LBL3, the local bit line is denoted as a local bit line LBL. By locating the local bit line LBL between the bit line BL and the source line SL, the memory string MS can be disposed in multiple stages. Hereinafter, the stage of the memory string MS is also referred to as a "tier". For example, the memory string MS may be connected between the bit line BL and the local bit line LBL, between two local bit lines LBL, and between the local bit line LBL and the source line SL.

In the memory block BLK having a segmented configuration, in one segment, a memory string group in which the plurality of memory strings MS are connected in parallel and a memory string group in which the plurality of other memory strings MS are connected in parallel are connected in series via the local bit line LBL. The memory block BLK illustrated in FIG. 21 has a configuration in which the memory block BLK has three local bit lines LBL, and four stages of the memory strings MS are disposed between the bit line BL and the source line SL.

In the memory block BLK illustrated in FIG. 21, the memory cell MC belonging to the memory string MS of a tier closest to the source line SL is selected. The select transistor ST1 corresponding to the selected memory cell MC is set to the ON state. On the other hand, the select transistor ST1 of the non-selected memory string MS of the tier (hereinafter, also referred to as a "selected tier") including the selected memory cell MC is set to the OFF state. The non-selected SGD of the selected tier is also referred to as a "non-conducted SGD". Then, the select gate line SGD other than the non-conducted SGD of the selected tier, that is, the select gate line SGD of the select transistor ST1 corresponding to the selected memory cell MC is referred to as a "conducted SGD". On the other hand, the select transistor ST1 of the memory string MS of the tier to which the selected memory cell MC does not belong is set to the ON state.

Figure 22:
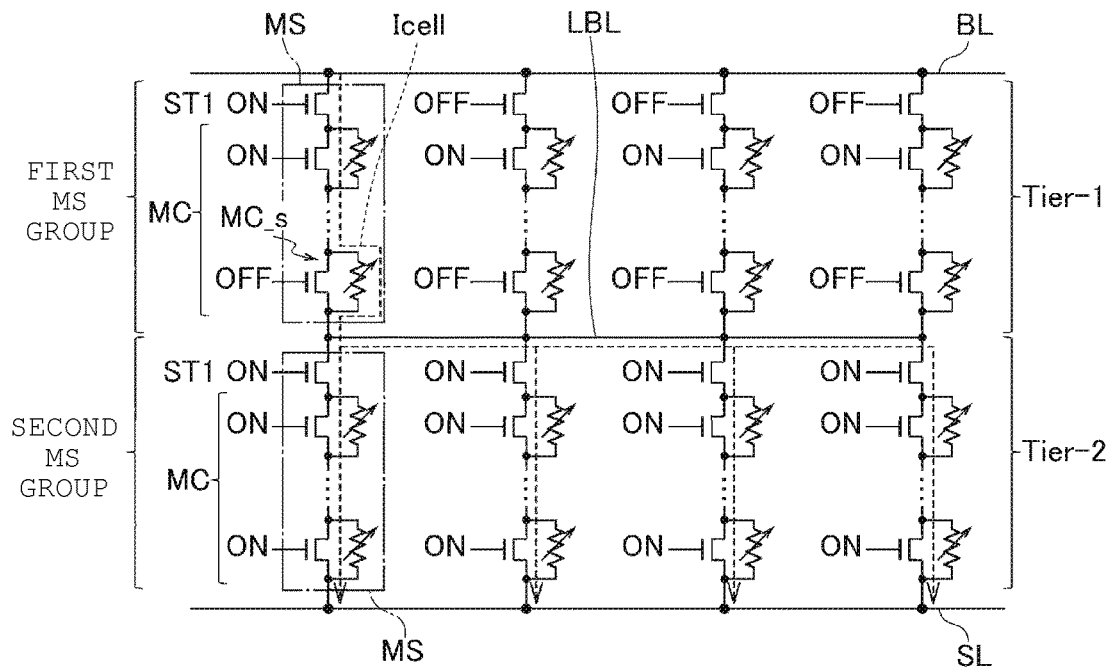
FIG. 22 is a block diagram illustrating a tiered configuration.

Hereinafter, the cell current flowing through the selected memory cell MC in the memory block BLK having the local bit line LBL will be described with reference to FIG. 22. FIG. 22 is a block diagram having a two-tier configuration in which one local bit line LBL is disposed between the bit line BL and the source line SL. Herein, a first tier (Tier-1) is formed between the bit line BL and the local bit line LBL, and a first memory string group (first MS group) is disposed in the first tier (Tier-1). In addition, a second tier (Tier-2) is formed between the local bit line LBL and the source line SL, and a second memory string group (second MS group) is disposed in the second tier (Tier-2).

In FIG. 22, a memory cell MC s belonging to the first tier (Tier-1) is selected, and the first tier (Tier-1) is the selected tier. The select transistor ST1 corresponding to the memory cell MC s is set to the ON state, and the select transistor ST1 of the non-selected memory string MS of the first tier (Tier-1) is set to the OFF state. Then, the select transistor ST1 of the second tier (Tier-2) is set to the ON state.

For this reason, as illustrated in FIG. 22, the magnitude of the cell current Icell flowing through the selected memory cell MC s is equal to the sum of the cell currents flowing through all the memory strings MS of the second tier (Tier-2). Therefore, by locating the local bit line LBL in the memory block BLK, even when the number of layers of the word line WL is increased, that is, the distance from the bit line BL to the source line SL becomes long, the amount of the cell current flowing through the selected memory cell MC can be secured. When the memory cell MC of the second tier (Tier-2) is also selected, similarly to the case where the memory cell MC of the first tier (Tier-1) is selected, the amount of the cell current flowing through the selected memory cell MC can be secured. That is, the magnitude of the cell current flowing through the selected memory cell MCs of the second tier (Tier-2) is equal to the sum of the cell currents flowing through all the memory strings MS of the first tier (Tier-1).

Next, returning to the description of the memory block BLK illustrated in FIG. 21, the range of the memory cell MC that is in the floating state in the write operation will be examined. Herein, as illustrated in FIG. 21 by the broken line A, a case where the memory cell MC of the memory string MS that belongs to the first segment SG1 and that is disposed between the local bit line LBL3 and the source line SL is selected will be examined. The selected memory cell MC is the memory cell MC closest to the source line SL. In this case, the memory cell MC belonging to the second segment SG2 and surrounded by the broken line B is the falsely selected memory cell. In the second segment SG2, the segment transistor STE and the falsely selected memory cell are in the OFF state. Herein, in the second segment SG2, the select transistor ST1 of the memory string MS disposed between the bit line BL and the local bit line LBL3 and the select transistor ST1 of the memory string MS to which the falsely selected memory cell belongs enter an ON state. Therefore, in FIG. 21, the region surrounded by the broken line C and hatched is in a floating state.

As described above, in the memory block BLK having the local bit line LBL in the segmented configuration, in some cases, the range of the floating state may be wide. As a result, the coupling capacitance is large, and the time during which the voltage difference dV at both ends of the variable resistance memory region MR of the falsely selected memory cell occurs becomes long.

Figure 23:
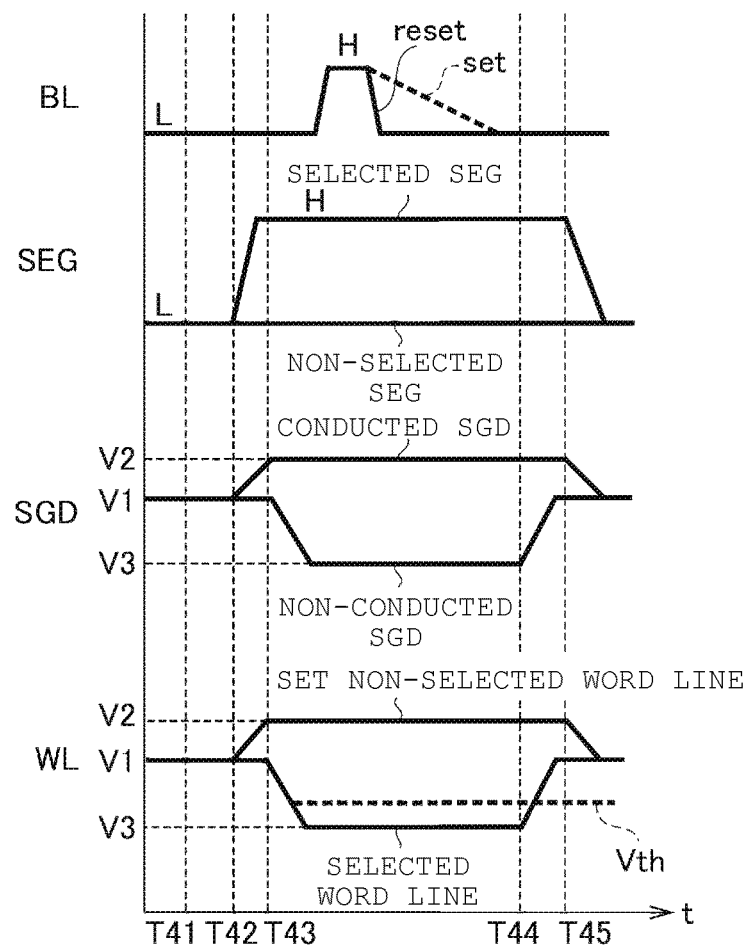
FIG. 23 illustrates a timing chart of an operation waveform of a memory device according to a modified example of the embodiment.

FIG. 23 illustrates an example of a timing chart of the operation of the memory device according to the embodiment for preventing the voltage difference dV for the write operation in the memory block BLK illustrated in FIG. 21. In FIG. 23, the gate line of the segment transistor STE of the segment to which the selected memory cell MC belongs is referred to as a "selected SEG", and the gate line of the segment transistor STE of each of the other segments is referred to as a "non-selected SEG".

At the time T41, all of the select gate lines SGD and the word lines WL are set to the first voltage V1. The first voltage V1 is a voltage at which the select transistor ST1 and the cell transistor SW enter an ON state and is, for example, +4 V.

Next, at the time T42, the conducted SGD and the set non-selected word line are set to the second voltage V2 at which the select transistor ST1 and the cell transistor SW are maintained in the ON state. The second voltage V2 is a voltage at which the select transistor ST1 and the cell transistor SW are maintained in the ON state even in a state where the voltage of the selected bit line BL is increased in the write operation and is, for example, 7 V. In addition, at the time T42, the voltage of the selected SEG is set from the L level (for example, −2 V) in which the segment transistor STE is in the OFF state to the H level (for example, +7 V) in which the segment transistor STE enters an ON state. The voltage of the non-selected SEG is maintained at the L level.

Then, at the time T43, the non-conducted SGD and the selected word line are set to the third voltage V3 (for example, −2 V) at which the select transistor ST1 and the cell transistor SW are in the OFF state. When the voltage of the selected word line is decreased below the threshold voltage Vth of the cell transistor SW in the process of decreasing the voltage of the selected word line from the first voltage V1 to the third voltage V3, the cell transistor SW of the selected memory cell MC is in the OFF state. The cell transistor SW is in the OFF state, so that a current flows through the variable resistance memory region MR of the selected memory cell MC in the subsequent write operation.

In this write operation, the voltage of the selected bit line BL is set from the L level (for example, 0 V) to the H level (for example, +4 V). After that, when the voltage of the selected bit line BL is rapidly decreased, reset write is performed in which the variable resistance memory region MR is in a high resistance reset state. On the other hand, when the voltage of the selected bit line BL is slowly decreased, set write is performed in which the variable resistance memory region MR is in a low resistance set state.

After the write operation for the selected memory cell MC is executed, at the time T44, the conducted SGD and the selected word line are set to the first voltage V1. Next, at the time T45, the non-conducted SGD and the set non-selected word line are set to the first voltage V1. In addition, the voltage of the selected SEG is set from the H level to the L level.

As described above, after the transition of the voltages of the conducted SGD and the set non-selected word line is completed, the cell transistor SW of the selected memory cell MC is in the OFF state. Then, after the cell transistor SW of the selected memory cell MC enters an ON state, the conducted SGD and the set non-selected word line are set to the voltages before the write operation. That is, the write operation described with reference to FIG. 23 is different from the write operation described with reference to FIG. 18 in that the voltage of the set non-selected word line and the voltage of the conducted SGD are set in the same manner and in that the voltage of the selected word line and the voltage of the non-conducted SGD are set in the same manner. This is due to the following reasons.

In the memory block BLK, in the standby state, the switch connected to the bit line BL of the memory string MS is turned off. The switch is the select transistor ST1 in the memory block BLK illustrated in FIG. 17, and is the segment transistor STE in the memory block BLK illustrated in FIG. 21. In the standby state, the transistors other than the above switches enter an ON state. The transistors that enter an ON state in the standby state are the cell transistor SW in the memory block BLK illustrated in FIG. 17 and are the cell transistor SW and the select transistor ST1 in the memory block BLK illustrated in FIG. 21.

In the memory block BLK illustrated in FIG. 21, in the write operation, the select transistor ST1 of the segment including the memory cell MC that is the write target is connected to the bit line BL. On the other hand, the select transistor ST1 of the segment not including the memory cell MC that is the write target is not connected to the bit line BL. Then, in the write operation, the cell current Icell flows from the bit line BL to the variable resistance memory region MR of the selected memory cell MC via the select transistor ST1 of the segment including the memory cell MC that is the write target.

For this reason, in the memory block BLK illustrated in FIG. 21, except for the select transistor ST1 of the selected tier, the conduction state of the select transistor ST1 is synchronized with the conduction state of the cell transistor SW of the non-selected memory cell MC. For example, the conduction state of the select transistor ST1 corresponding to the selected memory cell MC is synchronized with the conduction state of the cell transistor SW of the non-selected memory cell MC.

As the number of memory cells MC provided in the memory cell array 110 is larger, there is a possibility that the time during which the voltage difference dV occurs at both ends of the variable resistance memory region MR of the falsely selected memory is longer. That is, in the memory block BLK having the segmented configuration and having the local bit line LBL, data disturbance due to the boost is likely to occur.

The time during which the voltage difference dV occurs in the memory device according to the modified example of the embodiment is shorter than that in the operation method of the comparative example in which the device transitions to the voltage of the selected word line and the voltage of the non-selected word line simultaneously. That is, after transitioning the voltage of the set non-selected word line, the selected memory cell MC is allowed to be in the OFF state, and the selected memory cell MC is allowed to enter an ON state, and then, by transitioning the voltage of the set non-selected word line, the time during which the voltage difference dV occurs can be shortened. As a result, it is possible to prevent writing to the falsely selected memory cell.

As described above, as the number of memory cells MC provided in the memory cell array 110 is larger, the effect of preventing the writing to the falsely selected memory cell by the memory device according to the embodiment is greater. For example, when the memory block BLK has the segmented configuration and has the local bit line LBL, the writing in the non-selected memory cell MC can be prevented.

Other Embodiments

In the above description, an alloy type phase transition element ($Ge_2Sb_2Te_5$) is given as an example of the variable resistance memory region MR of the memory cell MC, but other elements may be used for the variable resistance memory region MR. For example, the variable resistance memory region MR may have a structure in which $Sb_2Te_3$ and GeTe of a superlattice layer as an interface type phase transition element are alternately stacked or a structure in which BiSbTe and GeTe are alternately stacked. In addition, the variable resistance memory region MR may have a structure in which Ge, Sb, and Te are alternately stacked or may have a structure containing a chalcogenide material. Alternatively, the variable resistance memory region MR may include any one of $TiO_X$, $WO_X$, $HfO_X$, $TaO_X$ and the like as a variable resistance film, or a magnetic tunnel junction (MTJ) element. Herein, the MTJ element may have a configuration including any one of a CoFe alloy, an NiFe alloy, and the like.

In addition, in the above description, the case where, when the word line WL has a positive voltage, the cell transistor SW enters an ON state and, when the word line WL has a negative voltage, the cell transistor SW is in the OFF state has been described. However, the relationship between the voltage of the word line WL and the conduction state of the cell transistor SW is not limited to the above case. For example, the example in which the cell transistor SW is an n-channel MOS transistor has been described above, but the cell transistor SW may be a p-channel MOS transistor.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory device comprising:
   a memory cell array having a plurality of memory strings, a plurality of first voltage applying electrodes, and a second voltage applying electrode, wherein each of the memory strings includes a select transistor and a plurality of memory cells connected in series, and each of the memory cells includes a cell transistor and a variable resistance layer connected in parallel, the cell transistor of each memory cell having a gate connected to one of the first voltage applying electrodes and the select transistor having a gate connected to the second voltage applying electrode; and
   a voltage setting circuit that is controlled to apply different voltages to the first voltage applying electrodes, wherein
   during a write operation that targets one of the memory cells in one of the memory strings, the voltage setting circuit is controlled to:
   at a first point in time, apply a first voltage to the first voltage applying electrodes, which include a selected first voltage applying electrode that is connected to the gate of the targeted memory cell, and non-selected first voltage applying electrodes that are respectively connected to the gates of other memory cells in the memory string of the targeted memory cell;
   at a second point in time after the first point time, maintain the voltage applied to the selected first voltage applying electrode at the first voltage and apply a second voltage higher than the first voltage to the non-selected first voltage applying electrodes;
   at a third point in time after the second point time, maintain the voltage applied to the non-selected first voltage applying electrodes at the second voltage and apply a third voltage lower than the first voltage to the selected first voltage applying electrode;
   at a fourth point in time after the third point time, maintain the voltage applied to the non-selected first voltage applying electrodes at the second voltage and apply the first voltage to the selected first voltage applying electrode; and
   at a fifth point in time after the fourth point time, maintain the voltage applied to the selected first voltage applying electrode at the first voltage and apply the first voltage to the non-selected first voltage applying electrodes.

2. The memory device according to claim 1, wherein
   during a time period between the third point in time and the fourth point in time, the cell transistor of the targeted memory cell is in an off state so that a current flows through the variable resistance layer of the targeted memory cell, and the cell transistor of each of the other memory cells is in an on state so that the current flows through the cell transistor.

3. The memory device according to claim 2, wherein
   the memory cell array further includes a third voltage applying electrode at first ends of the memory strings and a plurality of fourth voltage applying electrodes at respective second ends of the memory strings, and
   during the time period between the third point in time and the fourth point in time, a voltage applied to the fourth voltage applying electrode connected to the memory string of the targeted memory cell is increased to cause the current to flow through the memory string of the targeted memory cell.

4. The memory device according to claim 3, wherein a resistance of the variable resistance layer changes according to the current flowing therethrough.

5. The memory device according to claim 4, wherein the variable resistance layer becomes amorphous to go into a high resistance state or crystallized to go into a low resistance state according to the current flowing therethrough.

6. The memory device according to claim 1,
   wherein the memory cell array is formed on a semiconductor substrate,
   wherein the variable resistance layer extends in a first direction above the semiconductor substrate,
   wherein the cell transistor includes:
      a first semiconductor layer that extends in the first direction and covers a side surface of the variable resistance layer, and
      a first insulator layer that extends in the first direction and covers a side surface of the first semiconductor layer, and
   wherein the select transistor includes:
      a second semiconductor layer that extends in the first direction, and
      a second insulator layer that extends in the first direction and covers a side surface of the second semiconductor layer, and wherein the first semiconductor layer and the second semiconductor layer are continuous, and the first insulator layer and the second insulator layer are continuous.

7. The memory device according to claim 6, wherein the memory cell array includes a third voltage applying electrode between the memory strings and the semiconductor substrate and electrically connected to first ends of the memory strings, and a plurality of fourth voltage applying electrodes above the memory strings and electrically connected to respective second ends of the memory strings.

8. A memory device comprising:
a memory cell array having a plurality of memory strings, a plurality of first voltage applying electrode above a semiconductor substrate, a second voltage applying electrode above the first voltage applying electrode, a third voltage applying electrode between the memory strings and the semiconductor substrate, and a plurality of fourth voltage applying electrodes above the memory strings, wherein each of the memory strings includes a select transistor and a plurality of memory cells connected in series, and each of the memory cells includes a cell transistor and a variable resistance layer connected in parallel, the cell transistor of each memory cell having a gate connected to one of the first voltage applying electrodes and the select transistor having a gate connected to the second voltage applying electrode; and
a voltage setting circuit that is controlled to apply different voltages to the first voltage applying electrodes, wherein
during a write operation that targets one of the memory cells in one of the memory strings, the voltage setting circuit is controlled to:
at a first point in time, apply a first voltage to the first voltage applying electrodes, which include a selected first voltage applying electrode that is connected to the gate of the targeted memory cell, and non-selected first voltage applying electrodes that are respectively connected to the gates of other memory cells in the memory string of the targeted memory cell;
at a second point in time after the first point time, maintain the voltage applied to the selected first voltage applying electrode at the first voltage and apply a second voltage higher than the first voltage to the non-selected first voltage applying electrodes;
at a third point in time after the second point time, maintain the voltage applied to the non-selected first voltage applying electrodes at the second voltage and apply a third voltage lower than the first voltage to the selected first voltage applying electrode;
at a fourth point in time after the third point time, maintain the voltage applied to the non-selected first voltage applying electrodes at the second voltage and apply the first voltage to the selected first voltage applying electrode; and
at a fifth point in time after the fourth point time, maintain the voltage applied to the selected first voltage applying electrode at the first voltage and apply the first voltage to the non-selected first voltage applying electrodes.

9. The memory device according to claim 8, further comprising:
a connection device that electrically connects one of a first group of the memory strings and a second group of the memory strings to one of the fourth voltage applying electrodes.

10. The memory device according to claim 9, wherein, during the write operation, the conduction state of the select transistor in the memory string of the targeted memory cell is synchronized with a conduction state of the cell transistor of the other memory cells.

11. The memory device according to claim 9, wherein the connection device includes a first connection transistor that is turned on to connect the first group of the memory strings to said one of the fourth voltage applying electrodes, and a second connection transistor that is turned on to connect the second group of the memory strings to said one of the fourth voltage applying electrodes, and
during the write operation, the first or second connection transistor is turned on in synchronization with the conduction state of the cell transistor of the other memory cells.

12. The memory device according to claim 9, wherein the memory cell array further includes a local bit line, and the memory strings in each of the first and second groups are further divided into first and second sub-groups, and the memory strings of the first sub-group are connected in series to the memory strings of the second sub-group through the local bit line.

13. The memory device according to claim 12, wherein, during the write operation, the select transistor in the memory string of the targeted memory cell is turned on, and the select transistors of the memory strings in the same sub-group as the memory string of the targeted memory cell are turned off.

14. The memory device according to claim 13, wherein, during the write operation, the select transistors of the memory strings in two of the other sub-groups are turned on and the select transistors of the memory strings in one of the other sub-groups are turned off.

15. A method of performing a write operation in a memory device including a memory cell array having a plurality of memory strings, a plurality of first voltage applying electrodes, and a second voltage applying electrode, wherein each of the memory strings includes a select transistor and a plurality of memory cells connected in series, and each of the memory cells includes a cell transistor and a variable resistance layer connected in parallel, the cell transistor of each memory cell having a gate connected to one of the first voltage applying electrodes and the select transistor having a gate connected to the second voltage applying electrode, said method comprising:
at a first point in time, applying a first voltage to the first voltage applying electrodes, which include a selected first voltage applying electrode that is connected to the gate of a memory cell that is a write target, and non-selected first voltage applying electrodes that are respectively connected to the gates of other memory cells in the memory string of the write-target memory cell;
at a second point in time after the first point time, maintaining the voltage applied to the selected first voltage applying electrode at the first voltage and applying a second voltage higher than the first voltage to the non-selected first voltage applying electrodes;
at a third point in time after the second point time, maintaining the voltage applied to the non-selected first voltage applying electrodes at the second voltage and applying a third voltage lower than the first voltage to the selected first voltage applying electrode;
at a fourth point in time after the third point time, maintaining the voltage applied to the non-selected first voltage applying electrodes at the second voltage and applying the first voltage to the selected first voltage applying electrode; and at a fifth point in time after the fourth point time, maintaining the voltage applied to the selected first voltage applying electrode at the first voltage and applying the first voltage to the non-selected first voltage applying electrodes.

16. The method according to claim 15, wherein during a time period between the third point in time and the fourth point in time, the cell transistor of the write-target memory cell is in an off state so that a current flows through the variable resistance layer of the write-target memory cell, and the cell transistor of each of the other memory cells is in an on state so that the current flows through the cell transistor.

17. The method according to claim 16, wherein the memory cell array further includes a third voltage applying electrode at first ends of the memory strings and a plurality of fourth voltage applying electrodes at respective second ends of the memory strings, said method further comprising:

during the time period between the third point in time and the fourth point in time, increasing a voltage applied to the fourth voltage applying electrode connected to the memory string of the write-target memory cell to cause the current to flow through the memory string of the write-target memory cell.

18. The method according to claim 17, wherein a resistance of the variable resistance layer changes according to the current flowing therethrough.

19. The method according to claim 18, wherein the variable resistance layer becomes amorphous to go into a high resistance state or crystallized to go into a low resistance state according to the current flowing therethrough.

20. The method according to claim 15, wherein the memory device further includes a connection device that electrically connects one of a first group of the memory strings and a second group of the memory strings to a bit line, and the conduction state of the select transistor in the memory string of the write-target memory cell is synchronized with a conduction state of the cell transistor of the other memory cells.

* * * * *